(12) United States Patent
Bocian et al.

(10) Patent No.: US 7,312,100 B2
(45) Date of Patent: Dec. 25, 2007

(54) IN SITU PATTERNING OF ELECTROLYTE FOR MOLECULAR INFORMATION STORAGE DEVICES

(75) Inventors: David F. Bocian, Riverside, CA (US); Werner G. Kuhr, Oak Hills, CA (US); Jonathan S. Lindsey, Raleigh, NC (US); Veena Misra, Raleigh, NC (US)

(73) Assignee: The North Carolina State University, Raleign, NC (US)

( * ) Notice: Subject to any disclaimer, the term of this patent is extended or adjusted under 35 U.S.C. 154(b) by 0 days.

(21) Appl. No.: 10/837,028

(22) Filed: Apr. 30, 2004

(65) Prior Publication Data
US 2005/0207208 A1 Sep. 22, 2005

Related U.S. Application Data

(60) Provisional application No. 60/473,782, filed on May 27, 2003.

(51) Int. Cl.
*H01L 51/40* (2006.01)

(52) U.S. Cl. .............. 438/99; 257/40; 365/151; 365/153; 977/896; 977/943

(58) Field of Classification Search .......... 977/DIG. 1, 977/896, 943; 429/30, 303, 33, 42, 43; 524/200, 790; 530/391.3, 391.5, 391.9; 257/E21.007, 40; 365/151, 153; 205/334; 361/523; 424/1.53; 525/919; 8/408; 438/99
See application file for complete search history.

(56) References Cited

U.S. PATENT DOCUMENTS

| | | | | |
|---|---|---|---|---|
| 4,687,732 A | * | 8/1987 | Ward et al. | 435/6 |
| 5,429,708 A | * | 7/1995 | Linford et al. | 216/66 |
| 5,536,573 A | * | 7/1996 | Rubner et al. | 428/378 |
| 6,208,553 B1 | * | 3/2001 | Gryko et al. | 365/151 |
| 6,212,093 B1 | | 4/2001 | Lindsey | |
| 6,272,038 B1 | | 8/2001 | Clausen et al. | |
| 6,324,091 B1 | | 11/2001 | Gryko et al. | |
| 6,365,068 B1 | * | 4/2002 | Michot et al. | 252/500 |
| 6,381,169 B1 | | 4/2002 | Bocian et al. | |

(Continued)

OTHER PUBLICATIONS

Decher, "Fuzzy Nanoassemblies: Toward Layered Polymeric Multicomposites," Science, vol. 277 (Aug. 29, 1997), pp. 1232-1237.*

*Primary Examiner*—Richard T. Elms
*Assistant Examiner*—Michael Lulis
(74) *Attorney, Agent, or Firm*—Beyer Weaver LLP; Tom Hunter

(57) ABSTRACT

This invention pertains to methods assembly of organic molecules and electrolytes in hybrid electronic. In one embodiment, a method is provided that involves contacting a surface/electrode with a compound of formula: $R\text{-}L^2\text{-}M\text{-}L^1\text{-}Z^1$ where $Z^1$ is a surface attachment group; $L^1$ and $L^2$ are independently linker or covalent bonds; M is an information storage molecule; and R is a protected or unprotected reactive site or group; where the contacting results in attachment of the redox-active moiety to the surface via the surface attachment group; and ii) contacting the surface-attached information storage molecule with an electrolyte having the formula: J-Q where J is a charged moiety (e.g., an electrolyte); and Q is a reactive group that is reactive with the reactive group (R) and attaches J to the information storage molecule thereby patterning the electrolyte on the surface.

30 Claims, 11 Drawing Sheets

U.S. PATENT DOCUMENTS

| | | |
|---|---|---|
| 6,451,942 B1 | 9/2002 | Li et al. |
| 6,468,657 B1 * | 10/2002 | Hou et al. ................. 428/403 |
| 6,642,376 B2 | 11/2003 | Lindsey et al. |
| 6,657,884 B2 | 12/2003 | Bocian et al. |
| 6,664,462 B2 * | 12/2003 | Arakawa et al. ............ 136/263 |
| 6,674,121 B2 | 1/2004 | Misra et al. |
| 6,728,129 B2 | 4/2004 | Lindsey et al. |
| 6,777,516 B2 | 8/2004 | Li et al. |
| 6,921,475 B2 | 7/2005 | Kuhr et al. |
| 6,924,375 B2 | 8/2005 | Lindsey et al. |
| 6,943,054 B2 | 9/2005 | Bocian et al. |
| 6,944,047 B2 | 9/2005 | Rotenberg et al. |
| 2003/0050437 A1 * | 3/2003 | Montgomery ............... 530/334 |
| 2003/0142901 A1 * | 7/2003 | Lahann et al. ................ 385/18 |

* cited by examiner (1) 
Girard's reagent P (2) 
Girard's reagent T (3)

(4)

IN SITU PATTERNING OF ELECTROLYTE FOR MOLECULAR INFORMATION STORAGE DEVICES

CROSS-REFERENCE TO RELATED APPLICATIONS

This application claims priority to and benefit of U.S. Ser. No. 60/473,782, filed on May 27, 2003, which is incorporated herein by reference in its entirety for all purposes.

STATEMENT AS TO RIGHTS TO INVENTIONS MADE UNDER FEDERALLY SPONSORED RESEARCH AND DEVELOPMENT

This invention was made with Government support under Grant No: MDA972-01-C-0072, awarded by the DARPA. The Government of the United States of America may have certain rights in this invention.

FIELD OF THE INVENTION

This invention pertains to the field of molecular electronics. More specifically this invention pertains to methods of patterning and stepwise assembly of organic molecules and electrolytes in hybrid electronic components and devices.

BACKGROUND OF THE INVENTION

There has been considerable interest in the development of hybrid electronics devices and chips that utilize one or more organic molecules to store information in the discrete oxidation states of the molecule(s) (see, e.g., U.S. Pat. Nos. 6,208,553, 6,212,093, 6,272,038, 6,324,091, 6,381,169, and 6,451,942, and PCT Publication WO 01/03126, etc.).

General challenges in fabricating a hybrid chip containing molecular materials for information storage are that (1) the charge-storage molecule is desirably attached to an electroactive surface, (2) the electrolyte is desirably present in the same location as the charge-storage molecule but not elsewhere, and (3) the counterelectrode is desirably located at a controlled distance from the charge-storage molecules without shorts. Particularly pressing problems are that often the methods for attachment of molecules to surfaces often require very high concentrations, high temperature, and/or the use of reactive intermediates (see, e.g. Cleland et al. (1995) *J. Chem. Soc. Faraday Trans.* 91: 4001-4003; Buriak (1999) *Chem. Commun.* 1051-1060; Linford et al. (1995) *J. Am. Chem. Soc.* 117: 3145-3155; Hamers et al. (2000) *Acc. Chem. Res.* 33: 617-624; Haber et al. (2000) *J. Phys. Chem. B*, 104: 9947-9950). Such conditions are readily applicable to small robust molecules but become less satisfactory and often fail altogether as the molecules become larger and/or more elaborate.

One example in this regard is the attachment of molecules to Si or Ge. Thus, the reaction of an alcohol or thiol-containing molecule at elevated temperature (nearly 200° C.) at concentrations $\geq 0.1$ M (and often with neat materials; e.g., ~10 M) affords the siloxane or thiosiloxane linkage (Cleland et al. (1995) *J. Chem. Soc. Faraday Trans.* 91: 4001-4003). Ferrocene-alcohols tend to attach well under these conditions, porphyrin-alcohols attach less well, and triple-decker lanthanide sandwich coordination compounds bearing an alcohol tend to fail to attach altogether. Charge-storage molecules comprised of multiple triple deckers are ideally suited for storage of multiple bits of information (see, e.g., U.S. Pat. No. 6,212,093 B1; Schweikart et al. (2002) *J. Mater. Chem.*, 12: 808-828), but often cannot be attached to silicon or germanium under these conditions.

A second example employs the reaction of an alkene with a Si surface, affording an alkylsilane linkage (Buriak (1999) *Chem. Commun.*, 1051-1060). This procedure also requires very high concentrations for reaction. A third example is the attachment of charge-storage molecules to glassy carbon. McCreery has described the attachment of diazonium salt derivatives of simple aromatic compounds (e.g., stilbene) to glassy carbon electrodes (Ranganathan et al. (2001) *Nanolett.*, 1: 491-494). However, many redox-active molecules of interest for use in charge-storage applications, particularly those that store charge at low potential, react with diazonium salts. A case in point is given by ferrocene, which undergoes oxidation at 0.22 V versus $Ag/Ag^+$. Aryl diazonium salts are the electrophilic reagents of choice for substitution of the ferrocene nucleus (Weinmayr (1955) *J. Am. Chem. Soc.*, 77: 3012-3014; Broadhead and Pauson (1955) *Chem. Soc.*, 367-370; Gryko et al. (2000) *J. Org. Chem.* 65: 7356-7362). Thus, ferrocenes, and by extension many other desirable redox-active molecules, cannot be attached or are difficult to attach to glassy carbon via the standard method employing a reactant containing a diazonium salt.

Typically, the surface-attached molecules are either immersed in an electrolyte solution (e.g., $Bu_4NPF_6$ in $CH_2Cl_2$ solution) or a gel electrolyte (e.g., $Bu_4NPF_6$ in propylene carbonate followed by solvent evaporation. While these methods enable studies of the information-storage properties of the molecules, the methods for electrolyte deposition are not very amenable to device fabrication. In particular, it is desirable to be able to locate the electrolyte only in those regions of the chip where the molecules are located, to control the thickness and/or uniformity of the electrolyte layer, and to introduce the counterelectrode without creating shorts across the electrolyte/molecule region. Previously, little control can be exercised over patterning of the electrolyte, which directly affects the methods employed for introducing the counterelectrode.

SUMMARY OF THE INVENTION

This invention provides new methods of patterning electrolyte material into molecular-based devices designed for information storage and/or other applications. IN certain embodiments, these methods involve linking the electrolyte is linked directly to the information-storage molecules. This mitigates the need for a separate patterning step for the electrolyte overlayer.

Thus, in one embodiment, this invention provides a method of patterning an electrolyte on a surface. The method typically involves contacting the surface with a compound having the formula: $R-L^2-M-L^1-Z^1$ where $Z^1$ is a surface attachment group; $L^1$ and $L^2$ are independently linker or covalent bonds; M is an information storage molecule comprising a redox active moiety; and R is a protected or unprotected reactive site or group; whereby the contacting is under conditions that result in attachment of the redox-active moiety to the surface via the surface attachment group; and ii) contacting the surface-attached redox-active moiety with an electrolyte having the formula: J-Q where J is a charged moiety (e.g., an electrolyte); and Q is a reactive group that is reactive with the reactive group (R) under conditions that result in the attachment (e.g. covalent, ionic, etc.) of the charged moiety (J) to the information storage molecule thereby patterning the electrolyte on the surface. In certain embodiments, the surface attachment group ($Z^1$) reacts on contact with the surface and/or is photo activated, and/or is heat activated, and/or is activated by electromagnetic radiation. In certain embodiments, J is positively charged, while in certain other embodiments, J is negatively charged. In certain embodiments the redox-active moiety (M) includes, but is not limited to a redox-active moiety selected from the group consisting of a porphyrinic macrocycle, a porphyrin, a sandwich coordination compound of porphyrinic macrocycles, and a metallocene. Certain preferred redox-active moieties include, but are not limited to a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. In certain embodiments the reactive site Q includes, but is not limited to an acyl hydrazide, an amine, a dipyrrin, acac, a phenol, an alcohol, a diol, a thiol, an azide, a phenanthroline, a zirconium dichloride, alkyl halide, aldehyde, and/or a zirconium hydroxide. In certain embodiments $Z^1$ is a protected or unprotected reactive site or group including but not limited to a site or group selected from the group consisting of a carboxylic acid, an alcohol, a thiol, a selenol, a tellurol, a phosphonic acid, a phosphonothioate, an amine, and a nitrile. In certain embodiments -$L^1$-$Z^1$ includes, but is not limited to 4-carboxyphenyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl) phenyl, 4-hydroxyphenyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl, 4-mercaptophenyl, 2-(4-mercaptophenyl)ethynyl, 4-(2-(4-mercaptophenyl)ethynyl)phenyl, 4-mercaptomethylphenyl, 4-(2-mercaptoethyl)phenyl, 4-(3-mercaptopropyl)phenyl, 4-(2-(4-mercaptomethylphenyl)ethynyl)phenyl, 4-selenylphenyl, 2-(4-selenylphenyl)ethynyl, 4-selenylmethylphenyl, 4-(2-selenylethyl)phenyl, 4-(3-selenylpropyl)phenyl, 4-selenylmethylphenyl, 4-(2-(4-selenylphenyl)ethynyl)phenyl, 4-tellurylphenyl, 2-(4-tellurylphenyl)ethynyl, 4-(2-(4-tellurylphenyl)ethynyl)phenyl, 4-tellurylmethylphenyl, 4-(2-tellurylethyl)phenyl, 4-(3-tellurylpropyl)phenyl, 4-(2-(4-tellurylmethylphenyl)ethynyl)phenyl, 4-(dihydroxyphosphoryl)phenyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl, 4-(hydroxy(mercapto)phosphoryl)phenyl, 2-[4-(hydroxy(mercapto)phosphoryl)phenyl]ethynyl, 4-[2-[4-(hydroxy(mercapto)phosphoryl)phenyl]ethynyl]phenyl, 4-[(hydroxy(mercapto)phosphoryl)methyl]phenyl, 4-[2-(hydroxy(mercapto)phosphoryl)ethyl]phenyl, 4-[2-[4-(hydroxy(mercapto)phosphoryl)methylphenyl]ethynyl]phenyl, 4-cyanophenyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl]phenyl; 4-cyanobiphenyl, 4-aminophenyl, 2-(4-aminophenyl)ethynyl, 4-[2-(4-aminophenyl)ethynyl]phenyl, 4-aminobiphenyl, 1,1,1-tris[4-(S-acetylthiomethyl)phenyl]methyl, 4-{1,1,1-tris[4-(S-acetylthiomethyl)phenyl]methyl}phenyl, 1,1,1-tris[4-(dihydroxyphosphoryl)phenyl]methyl, 4-{1,1,1-tris[4-(dihydroxyphosphoryl)phenyl]methyl}phenyl, 1,1,1-tris[4-(dihydroxyphosphorylmethyl)phenyl]methyl, and/or 4-{1,1,1-tris[4-(dihydroxyphosphorylmethyl)phenyl]methyl}phenyl. In certain embodiments $L^1$ and $L^2$ are independently selected from the group consisting of a covalent bond, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, and 4,4"-terphenyl. In certain embodiments the electrolyte bearing a reactive site (Q) includes, but is not limited to an acyl hydrazide, an amine, a dipyrrin, acac, a phenol, an alcohol, a diol, a thiol, an azide, a phenanthroline, a zirconium dichloride, and a zirconium hydroxide. In certain embodiments R includes, but is not limited to a carboxaldehyde, a ketone, an o-hydroxycarboxaldehyde, a dipyrrin, and/or acac. In some embodiments, R is a carboxaldehyde or ketone and Q is an acylhydrazide. In some embodiments, R is a carboxaldehyde or ketone and Q is an amine. In some embodiments, R is an o-hydroxycarboxaldehyde and Q is an amine. In some embodiments, R is an o-hydroxycarboxaldehyde and Q is an acyl hydrazide. In some embodiments, R is a dipyrrin and Q is a dipyrrin. In some embodiments, R is acac and Q is acac.

The method can, optionally, further involve contacting the charged moiety (J) with a reagent having formula $Z^2$-$L^3$-K Y where K comprises a group having a charge complementary to (e.g. opposite sign to) the charge of J; $L^3$ is a covalent bond or a linker; $Z^2$ is a surface attachment group; and Y is a counterion; whereby K electrostatically associates with J thereby providing a counterion group associated with the information storage molecule where the counterion comprises the surface attachment group $Z^3$. The method can further comprise constructing a counter-electrode by binding (e.g. covalently) an electrode to the surface attachment group $Z^2$. The electrode is typically a conductive material, a semiconductive material or a superconductive material. In certain embodiments $Z^2$ is a protected or unprotected reactive site or group including, but not limited to, a carboxylic acid, an alcohol, a thiol, a selenol, a tellurol, a phosphonic acid, a phosphonothioate, an amine, and/or a nitrile. In certain embodiments $L^3$-$Z^2$ includes, but is not limited to 4-carboxyphenyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl) phenyl, 4-hydroxyphenyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl, 4-mercaptophenyl, 2-(4-mercaptophenyl)ethynyl, 4-(2-(4-mercaptophenyl)ethynyl)phenyl, 4-mercaptomethylphenyl, 4-(2-mercaptoethyl)phenyl, 4-(3-mercaptopropyl)phenyl, 4-(2-(4-mercaptomethylphenyl)ethynyl)phenyl, 4-selenylphenyl,
2-(4-selenylphenyl)ethynyl, 4-selenylmethylphenyl, 4-(2-selenylethyl)phenyl,
4-(3-selenylpropyl)phenyl, 4-selenylmethylphenyl, 4-(2-(4-selenylphenyl)ethynyl)phenyl,
4-tellurylphenyl, 2-(4-tellurylphenyl)ethynyl, 4-(2-(4-tellurylphenyl)ethynyl)phenyl,
4-tellurylmethylphenyl, 4-(2-tellurylethyl)phenyl, 4-(3-tellurylpropyl)phenyl,
4-(2-(4-tellurylmethylphenyl)ethynyl)phenyl, 4-(dihydroxyphosphoryl)phenyl,
2-[4-(dihydroxyphosphoryl)phenyl]ethynyl,
4-[2-[4-(dihydroxyphosphoryl)phenyl]ethynyl]phenyl,
4-[(dihydroxyphosphoryl)methyl]phenyl, 4-[2-(dihydroxyphosphoryl)ethyl]phenyl,
4-[2-[4-(dihydroxyphosphoryl)methylphenyl]ethynyl]phenyl,
4-(hydroxy(mercapto)phosphoryl)phenyl,
2-[4-(hydroxy(mercapto)phosphoryl)phenyl]ethynyl,
4-[2-[4-(hydroxy(mercapto)phosphoryl)phenyl]ethynyl]phenyl,
4-[(hydroxy(mercapto)phosphoryl)methyl]phenyl,
4-[2-(hydroxy(mercapto)phosphoryl)ethyl]phenyl,
4-[2-[4-(hydroxy(mercapto)phosphoryl)methylphenyl]ethynyl]phenyl, 4-cyanophenyl,
2-(4-cyanophenyl)ethynyl, 4-[2-(4-cyanophenyl)ethynyl]phenyl, 4-(cyanomethyl)phenyl,
4-(2-cyanoethyl)phenyl, 4-[2-[4-(cyanomethyl)phenyl]ethynyl]phenyl; 4-cyanobiphenyl,
4-aminophenyl, 2-(4-aminophenyl)ethynyl, 4-[2-(4-aminophenyl)ethynyl]phenyl,
4-aminobiphenyl, 1,1,1-tris[4-(S-acetylthiomethyl)phenyl]methyl,
4-{1,1,1-tris[4-(S-acetylthiomethyl)phenyl]methyl}phenyl,
1,1,1-tris[4-(dihydroxyphosphoryl)phenyl]methyl,
4-{1,1,1-tris[4-(dihydroxyphosphoryl)phenyl]methyl}phenyl,
1,1,1-tris[4-(dihydroxyphosphorylmethyl)phenyl]methyl, and
4-{1,1,1-tris[4-(dihydroxyphosphorylmethyl)phenyl]methyl}phenyl. In certain embodiments $L^3$ includes, but is not limited to a covalent bond, 1,4-phenylene, 4,4'-diphenylethyne, 4,4'-diphenylbutadiyne, 4,4'-biphenyl, 4,4'-stilbene, 1,4-bicyclooctane,
4,4'-azobenzene, 4,4'-benzylideneaniline, and/or 4,4"-terphenyl. The counterion (K) includes, but is not limited to a halogen, an alkalai earth metal, $PF_6$, and $ClO_4$. $Z^2$-$L^3$-$K^-Y^+$ can include, but is not limited to, 11-mercaptoundecanoic acid, 16-mercaptohexadecanoic acid, 3-mercapto-1-propanoic acid, (2-mercaptoethyl)trimethylammonium bromide, or 4-(mercaptomethyl)benzenesulfonic acid. In certain embodiments the counterion is altered by an ion-exchange process.

In another embodiment, this invention provides an electroactive substrate comprising a first zone where the first zone comprises a surface with an attached redox-active moiety according to the formula: R-$L^2$-M-$L^1$-$Z^1$-S where: S is a substrate; $Z^1$ is a surface attachment group; $L^1$ and $L^2$ are independently selected linkers or covalent bonds; M is an information storage molecule comprising a redox active moiety; and R is a protected or unprotected reactive site or group. In certain embodiments, preferred substrates (S), include, but are not limited to conductors (e.g. Au, In, Si, Sn, etc.), semiconductors, or superconductors as described herein. M is typically an information storage molecule as described above. In certain embodiments $Z^1$, before coupling to S, and/or -$L^1$-$Z^1$ before coupling to S, and/or $L^1$ and/or $L^2$, and/or R are as described above. In certain embodiments, the electroactive substrate further comprises a second zone where the second zone comprises a surface with an attached redox-active moiety where the redox active moiety is different than M.

In still another embodiment, this invention provides electroactive substrate comprising a first zone where the first zone comprises a surface with an attached redox-active moiety according to the formula: J-$L^2$-M-$L^1$-$Z^1$--S where: S is a substrate; $Z^1$ is a surface attachment group; $L^1$ and $L^2$ are independently selected linkers or covalent bonds; M is an information storage molecule comprising a redox active moiety; and J is a charged moiety (e.g. a positively or negatively charged moiety). In certain embodiments, preferred substrates (S), include, but are not limited to conductors (e.g. Au, In, Si, Sn, etc.), semiconductors, or superconductors as described herein. M is typically an information storage molecule as described above. In certain embodiments $Z^1$, before coupling to S, and/or -$L^1$-$Z^1$ before coupling to S, and/or $L^1$ and/or $L^2$, and/or R are as described above. In certain embodiments, the electroactive substrate further comprises a second zone where the second zone comprises a surface with an attached redox-active moiety where the redox active moiety is different than M.

This invention also provides an electroactive substrate comprising a first zone where the first zone comprises a surface with an attached redox-active moiety according to the formula: $Z^2$-$L^3$-K----J-$L^2$-M-$L^2$-$Z^1$--S where S is a substrate; $Z^1$ and $Z^2$ are independently selected surface attachment groups; $L^1$, $L^2$, and $L^3$ are independently selected linkers or covalent bonds; M is an information storage molecule comprising a redox active moiety; and J K are independently selected charged moieties of opposite charge to each other. In certain embodiments, preferred substrates (S), include, but are not limited to conductors (e.g. Au, In, Si, Sn, etc.), semiconductors, or superconductors as described herein. M is typically an information storage molecule as described above. In certain embodiments $Z^1$, before coupling to S, and/or -$L^1$-$Z^1$ before coupling to S, and/or $L^1$ and/or $L^2$, and/or R, and/or K, and/or J are as described above. In certain embodiments, the electroactive substrate further comprises a second zone where the second zone comprises a surface with an attached redox-active moiety where the redox active moiety is different than M.

This invention also provides a redox-active storage cell. The cell typically comprises a composition of the formula: E-$Z^2$-$L^3$-K----J-$L^2$-M-$L^1$-$Z^1$--S where S is a substrate; $Z^1$ and $Z^2$ are independently selected surface attachment groups; $L^1$, $L^2$, and $L^3$ are independently selected linkers or covalent bonds; M is an information storage molecule comprising a redox active moiety; J K are independently selected charged moieties of opposite charge to each other and E is an electrode or counterelectrode. In certain embodiments, preferred substrates (S), and/or electrodes and/or counterelectrodes, include, but are not limited to conductors (e.g. Au, In, Si, Sn, etc.), semiconductors, or superconductors as described herein. M is typically an information storage molecule as described above. In certain embodiments $Z^1$, before coupling to S, and/or -$L^1$-$Z^1$ before coupling to S, and/or $L^1$ and/or $L^2$, and/or R, and/or K, and/or J are as described above. In certain embodiments, the electroactive substrate further comprises a second zone where the second zone comprises a surface with an attached redox-active moiety where the redox active moiety is different than M. The storage cell can be encapsulated.

This invention also provides a method of storing data. The method typically involves providing an apparatus comprising one or more storage cells as described herein, and applying a voltage to the electrode at sufficient current to set an oxidation state of M. In certain embodiments the voltage ranges up to about 2 volts. The voltage can be the output of an integrated circuit (e.g. a logic gate). The method can further involve detecting the oxidation state of M and thereby reading out the data stored therein. Detecting the oxidation state of the storage medium (e.g. M) can further comprise refreshing the oxidation state of the storage medium. The detecting can comprise analyzing a readout signal in the time domain and/or analyzing a readout signal in the frequency domain. The detecting can comprise performing a Fourier transform on the readout signal. The detecting can utilize a voltammetric method. In certain embodiments the detecting utilizes impedance spectroscopy. In certain embodiments the detecting comprises exposing the storage medium (e.g., M) to an electric field to produce an electric field oscillation having characteristic frequency and detecting the characteristic frequency. In certain embodiments M has at least eight different and distinguishable oxidation states.

In certain embodiments this invention provides a computer system comprising a memory device, the memory device comprising a storage cell as described herein. In certain embodiments this invention provides a computer system comprising a central processing unit, a display, a selector device, and a memory device, the memory device comprising a storage cell as described herein.

Definitions

The term "electrolyte" refers to a material (e.g. solid, liquid, gel) through which electricity may be conducted. Electrolytes used in this invention typically provide dissociated ions that mediate the carrying of charge.

Two groups (e.g. Q and R) are said to be "complementary" when they can undergo a chemical reaction with each other to form a covalent bond. Where the groups are charged groups, they can be said to be complementary when they are oppositely charged and/or capable of forming an ionic bond.

The term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{2+}(aq) \rightarrow Fe^{3+}(aq) + e^-$ because electrons are lost from the species being oxidized, $Fe^{2+}(aq)$, despite the apparent production of electrons as "free" entities in oxidation reactions. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

The term "multiple oxidation states" means more than one oxidation state. In preferred embodiments, the oxidation states may reflect the gain of electrons (reduction) or the loss of electrons (oxidation).

The term "electrode" refers to any medium capable of transporting charge (e.g. electrons) to and/or from a storage molecule. Preferred electrodes are metals or conductive organic molecules. The electrodes can be manufactured to virtually any 2-dimensional or 3-dimensional shape (e.g. discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g. a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The term "reference electrode" is used to refer to one or more electrodes that provide a reference (e.g. a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The term "redox-active unit" or "redox-active subunit" refers to a molecule or component of a molecule that is capable of being oxidized or reduced by the application of a suitable voltage.

The term "redox-active" molecule refers to a molecule or component of a molecule that is capable of being oxidized or reduced by the application of a suitable voltage.

The terms "charge storage molecule" and "information storage molecule" are used interchangeable to refer to a redox-active molecule that can be used to store information.

The term "subunit", as used herein, refers to a redox-active component of a molecule.

The terms "storage molecule" or "memory molecule" refer to a molecule having one or more oxidation states that can be used for the storage of information (e.g. a molecule comprising one or more redox-active subunits). Preferred storage molecules have two or more different and distinguishable non-neutral oxidation states.

The term "storage medium" refers to a composition comprising two or more storage molecules. The storage medium can contain only one species of storage molecule or it can contain two or more different species of storage molecule. In preferred embodiments, the term "storage medium" refers to a collection of storage molecules. Preferred storage media comprise a multiplicity (at least 2) of different and distinguishable (preferably non-neutral) oxidation states. The multiplicity of different and distinguishable oxidation states can be produced by the combination of different species of storage molecules, each species contributing to said multiplicity of different oxidation states and each species having a single non-neutral oxidation state. Alternatively or in addition, the storage medium can comprise one or more species of storage molecule having a multiplicity of non-neutral oxidation states. The storage medium can contain predominantly one species of storage molecule or it can contain a number of different storage molecules. The storage media can also include molecules other than storage molecules (e.g. to provide chemical stability, suitable mechanical properties, to prevent charge leakage, etc.).

The term "electrochemical cell" typically refers to a reference electrode, a working electrode, a redox-active molecule (e.g. a storage medium), and, if necessary, some means (e.g., a dielectric) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g. a working electrode and a reference electrode). The storage cells can be individually addressed (e.g. a unique electrode is associated with each memory element) or, particularly where the oxidation states of different memory elements are distinguishable, multiple memory elements can be addressed by a single electrode. The memory element can optionally include a dielectric (e.g. a dielectric impregnated with counterions).

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched.

The terms "sandwich coordination compound" or "sandwich coordination complex" refer to a compound of the formula $L^n M^{n-1}$, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) *Chemical Society Reviews* 26: 433-442). Sandwich coordination complexes include, but are not limited to "double-decker sandwich coordination compound" and "triple-decker sandwich coordination compounds". The synthesis and use of sandwich coordination compounds is described in detail in U.S. Pat. No. 6,212,093B1.

The term "double-decker sandwich coordination compound" refers to a sandwich coordination compound as described above where n is 2, thus having the formula $L^1$--$M^1$--$L^2$, wherein each of $L^1$ and $L^2$ may be the same or different (see, e.g., Jiang et al. (1999) *J. Porphyrins Phthalocyanines* 3: 322-328).

The term "triple-decker sandwich coordination compound" refers to a sandwich coordination compound as described above where n is 3, thus having the formula $L^1$--$M^1$ $L^2$--$M^2$--$L^3$, wherein each of $L^1$, $L^2$ and $L^3$ may be the same or different, and $M^{M2}$ may be the same or different (see, e.g., Arnold et al. (1999) *Chemistry Letters* 483-484).

A "linker" is a molecule used to couple two different molecules, two subunits of a molecule, or a molecule to a substrate.

A "substrate" is a, preferably solid, material suitable for the attachment of one or more molecules. Substrates can be formed of materials including, but not limited to glass, plastic, silicon, germanium, minerals (e.g. quartz), semiconducting materials (e.g. doped silicon, doped germanium, etc.), ceramics, metals, etc.

The term "aryl" refers to a compound whose molecules have the ring structure characteristic of benzene, naphthalene, phenanthrene, anthracene, etc. (i.e., either the 6-carbon ring of benzene or the condensed 6-carbon rings of the other aromatic derivatives). For example, an aryl group may be phenyl or naphthyl ($C_{10}H_9$). It is recognized that the aryl group, while acting as substituent can itself have additional substituents (e.g. the substituents provided for $S''$ in the various Formulas herein).

The term "alkyl" refers to a paraffinic hydrocarbon group which may be derived from an alkane by dropping one hydrogen from the formula. Examples are methyl ($CH_3$—), ethyl ($C_2H_5$—), propyl ($CH_3CH_2CH_2$—), isopropyl (($CH_3)_2CH_3$—).

The term "halogen" refers to one or the electronegative elements of group VIIB of the periodic table (fluorine, chlorine, bromine, iodine, astatine).

The term "nitro" refers to the NO₂ group.

The term "amino" refers to the NH₂ group.

The term "perfluoroalkyl" refers to an alkyl group where every hydrogen atom is replaced with a fluorine atom.

The term "perfluoroaryl" refers to an aryl group where every hydrogen atom is replaced with a fluorine atom.

The term "pyridyl" refers to an aryl group where one CH unit is replaced with a nitrogen atom.

The term "cyano" refers to the —CN group.

The term "thiocyanato" refers to the —SCN group.

The term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

The term "sulfonyl" refers to a group of composition $RSO_2$— where R is some alkyl, aryl, cycloalkyl, perfluoroalkyl, or perfluoroaryl group. Examples include, but are not limited to methylsulfonyl, phenylsulfonyl, p-toluenesulfonyl, etc.

The term "carbamoyl" refers to the group of composition $R^1(R^2)NC(O)$— where $R^1$ and $R^2$ are H or some alkyl, aryl, cycloalkyl, perfluoroalkyl, or perfluoroaryl group. Examples include, but are not limited to N-ethylcarbamoyl, N,N-dimethylcarbamoyl, etc.

The term "amido" refers to the group of composition $R^1CON(R^2)$— where $R^1$ and $R^2$ are H or some alkyl, aryl, cycloalkyl, perfluoroalkyl, or perfluoroaryl group. Examples include, but are not limited to acetamido, N-ethylbenzamido, etc.

The term "acyl" refers to an organic acid group in which the OH of the carboxyl group is replaced by some other substituent (RCO—). Examples include, but are not limited to acetyl, benzoyl, etc.

In preferred embodiments, when a metal is designated by "M" or "M$^n$", where n is an integer, it is recognized that the metal may be associated with a counterion.

The term "substituent" as used in the formulas herein, particularly designated by S or S" where n is an integer, in a preferred embodiment refer to redox-active groups (subunits) that can be used to adjust the redox potential(s) of the subject compound. Preferred substituents include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. In preferred embodiments, a substituted aryl group is attached to a porphyrin or a porphyrinic macrocycle, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

Particularly preferred substituents include, but are not limited to, 4-chlorophenyl, 3-acetamidophenyl, 2,4-dichloro-4-trifluoromethyl). Preferred substituents provide a redox potential range of less than about 5 volts, preferably less than about 2 volts, more preferably less than about 1 volt.

The phrase "provide a redox potential range of less than about X volts" refers to the fact that when a substituent providing such a redox potential range is incorporated into a compound, the compound into which it is incorporated has an oxidation potential less than or equal to X volts, where X is a numeric value.

BRIEF DESCRIPTION OF THE DRAWINGS

FIG. 11A graphically illustrates a computer system embodying the memory devices described herein. Typically the memory device will be fabricated as a sealed "chip". Ancillary circuitry on the chip and/or in the computer permits writing bits into the memory and retrieving the written information as desired. FIG. 11B illustrates the memory devices of this invention integrated into a standard computer architecture or computer system 200.

DETAILED DESCRIPTION

This invention provides new methods of patterning electrolyte material into molecular-based devices designed for information storage and or other applications. In these methods, the electrolyte can be linked directly (or indirectly through a linker) to the information-storage molecules. This mitigates the need for a separate patterning step for the electrolyte overlayer.

Figure 1A:
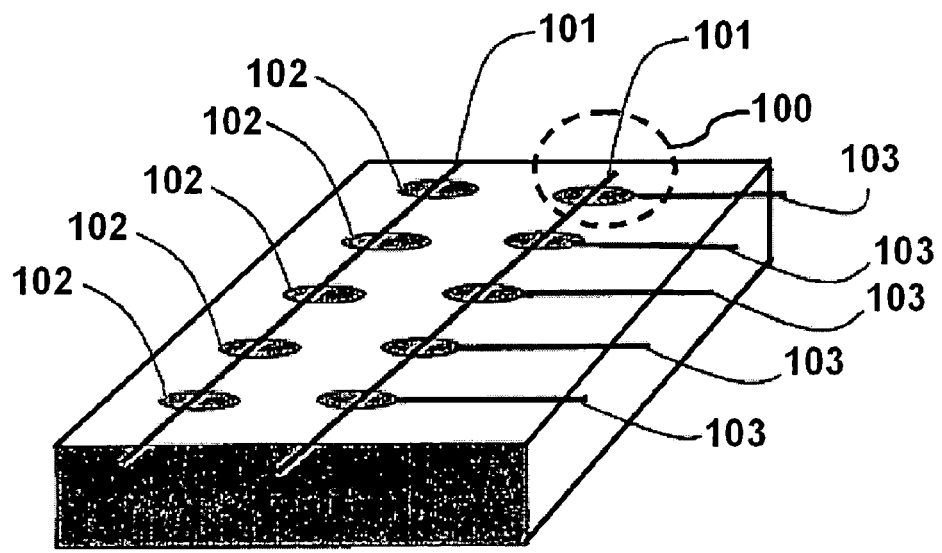
FIGS. 1A and 1B illustrate a basic molecular memory unit "storage cell" that can be fabricated using the methods of this invention. The basic memory device, a "storage cell" 100 comprises a working electrode 101 electrically coupled to a storage medium 102 comprising a multiplicity of storage molecules 105. The storage cell optionally includes an electrolyte 107 and a reference electrode 103. The storage medium has a multiplicity of different and distinguishable oxidation states, preferably a multiplicity of different and distinguishable non-neutral oxidation states, and can change oxidation (charge) state when a voltage or signal is applied thereby adding or removing one or more electrons.
Figure 1B:
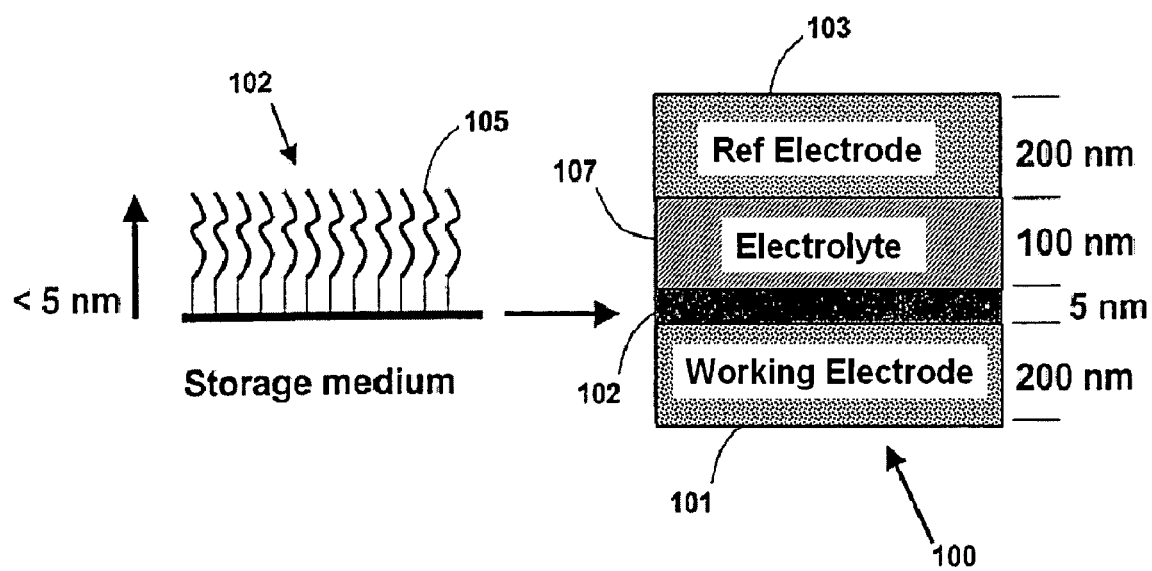

A typical molecular memory device that can be made using the methods of this invention is schematically illustrated in FIGS. 1A and 1B. The basic memory device, a "storage cell" 100 comprises a working electrode 101 electrically coupled to a storage medium 102 comprising a multiplicity of storage molecules 105. The storage cell optionally includes an electrolyte 107 and a reference electrode 103. The storage medium has a multiplicity of different and distinguishable oxidation states, preferably a multiplicity of different and distinguishable non-neutral oxidation states, and can change oxidation (charge) state when a voltage or signal is applied thereby adding or removing one or more electrons. Each oxidation state represents a particular bit. Where the storage medium supports eight different and distinguishable oxidation states it stores one byte. The storage medium remains in the set oxidation state until another voltage is applied to alter that oxidation state. The oxidation state of the storage medium can be readily determined using a wide variety of electronic (e.g. amperometric, coulometric, voltammetric) methods thereby providing rapid readout (see, e.g., WO 01/03126).

While the various embodiments, described herein are illustrated with respect to memory devices (e.g., as illustrated in FIG. 1), it will be appreciated that these methods are readily adapted to the incorporation of organic molecules and/or dielectric materials into a wide variety of electronic components and/or devices.

I. Synthesis/Patterning Strategy.

Figure 2:
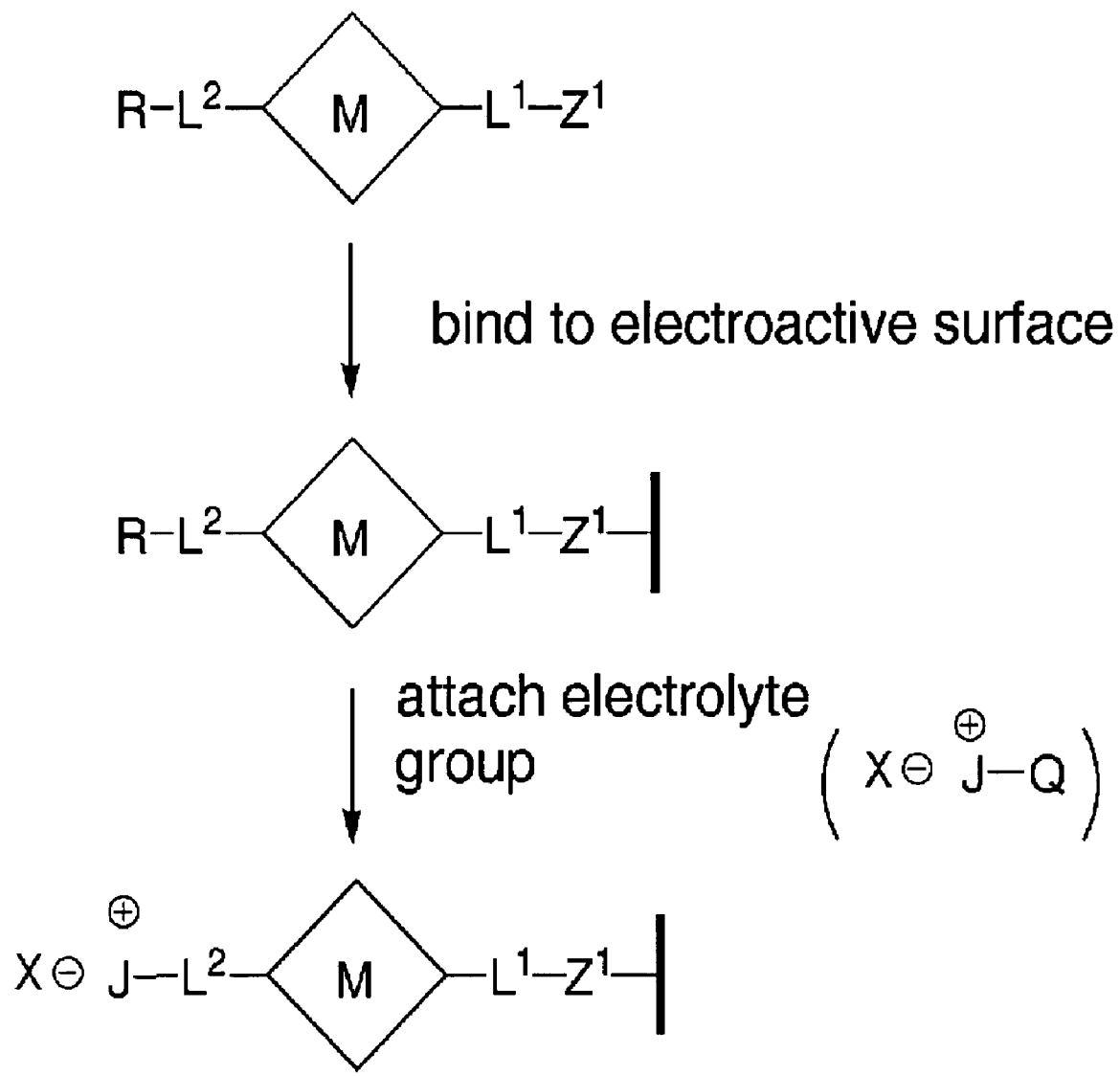
FIG. 2 shows Scheme 1 illustrating a two-step fabrication strategy for introducing an electrolyte adjacent to the redox-active molecule (M).

One approach toward "patterning" the electrolyte is schematically outlined in Scheme 1 (FIG. 2). In certain embodiments, the molecules for information storage (redox-active molecule) are constructed with a surface-attachment group ($Z^1$) and a reactive group (R) for a later derivatization reaction. Note that Z and R can be covalently linked to the information storage molecule(s) (M) and/or can be separated from the information storage molecule(s) by linkers $L^1$ and/or $L^2$, respectively. In one approach, the molecules are attached to the surface in a reaction between the surface and/or a functional group attached to the surface and the surface attachment group $Z^1$ thereby yielding a self-assembled monolayer (SAM). In certain embodiments, the surface-attachment group $Z^1$ can contain a proton or protecting group that is removed upon attachment to the surface or can be removed (e.g. chemically, by photoactivation, by heat activation, by electromagnetic radiation activation, etc.) to cause the Z group to react with the surface (e.g. electrode). Reaction typically occurs selectively at the surface attachment group.

The SAM can be treated with a compound ($X^- \; {}^+J$-Q) bearing a reactive site (Q) and one or more charged groups ($^+J$). The treatment is done under conditions that result in reaction of R and Q, thereby covalently attaching the $^+J$ molecules to the SAM. This effectively produces a charged layer directly above the information-storage molecule(s) (M). The charged layer can be used as a recognition site for the non-covalent deposition of additional electrolyte material, or can itself serve as an electrolyte.

Figure 3:
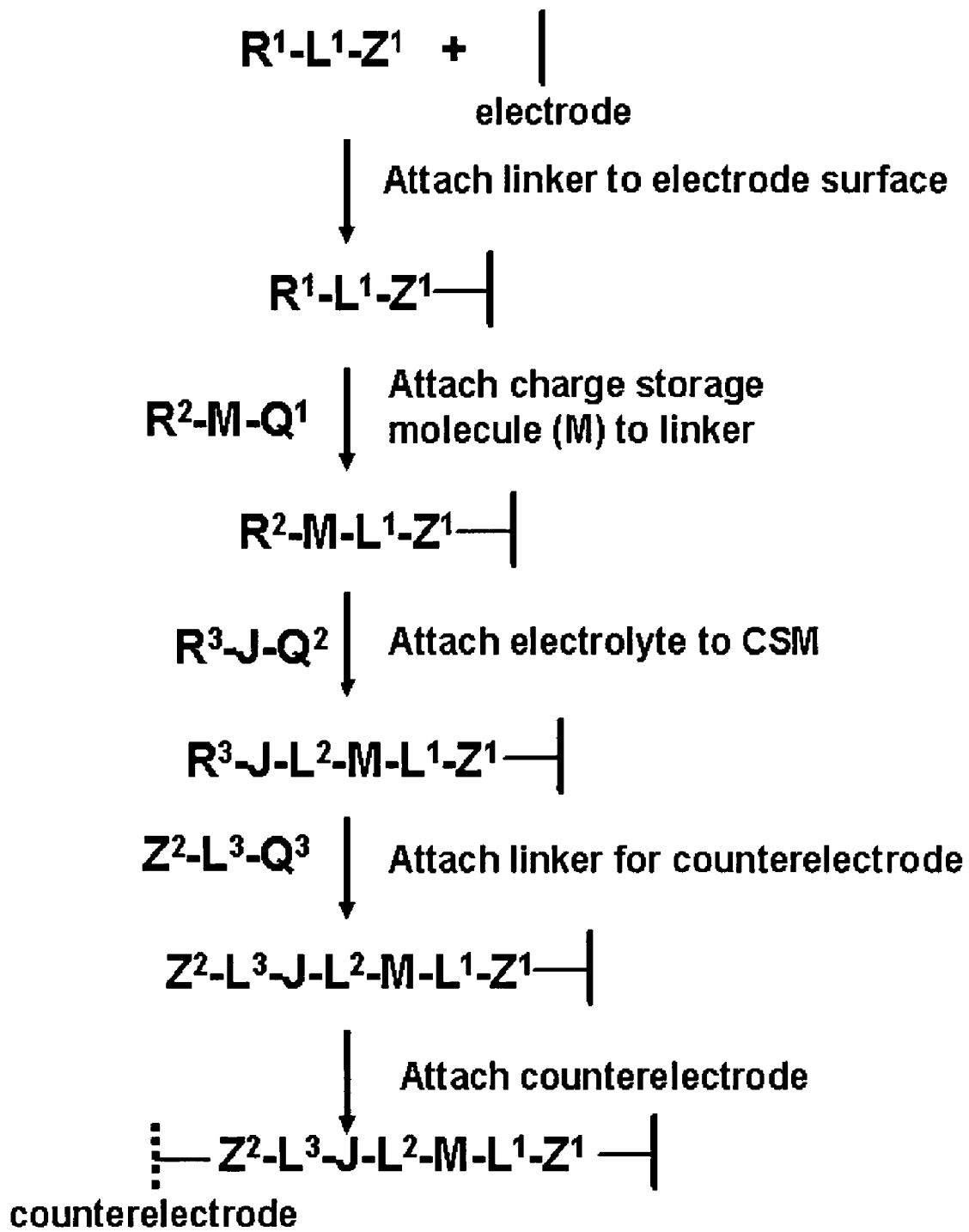
FIG. 3 shows Scheme 2 illustrating a multi-step fabrication strategy for assembling an information storage device comprised of a charge-storage molecule (information storage molecule/redox-active molecule) and an attached electrolyte in a sandwich architecture between two electrodes.

In certain embodiments, the formation of the initial SAM can be accomplished in a stepwise manner (see, e.g., Scheme 2 shown in FIG. 3). Thus, for example, a linker $L^1$ bearing a surface attachment group $Z^1$ and reactive functional group $R^1$ can be exposed under appropriate conditions to the electrode (or other surface), whereupon binding occurs. The linker can be a linear structure with a single binding site or a multi-legged linker with multiple binding sites for attachment to the surface. An information storage molecule (e.g. charge-storage molecule) bearing a functional group $Q^1$ complementary to that of $R^1$ (but not to $R^2$) is then added, resulting in the binding of $Q^1$ and $R^1$ and attaching the information storage molecule (M) to the linker ($L^1$).

An electrolyte (J) bearing functional groups $Q^2$ and $R^3$ is allowed to react with the end group $R^2$ on the information storage molecule thereby creating linker $L^2$. Reaction occurs smoothly given the complementary nature of the groups $Q^2$ and $R^2$.

A linker for attachment to the counterelectrode is attached to the end of the electrolyte by reaction of groups $Q^3$ and $R^3$, thereby attaching linker $L^3$. Then, the counterelectrode is attached to the surface attachment group $Z^2$. The advantages of this approach are that the first linker can be attached under suitable conditions, with the remaining components assembled in a stepwise manner. This approach avoids the strategy requiring the pre-synthesis of an elaborate molecular entity composed of $Z^3$-$L^3$-J-$L^2$-M-$L^1$-$Z^1$.

Figure 4:
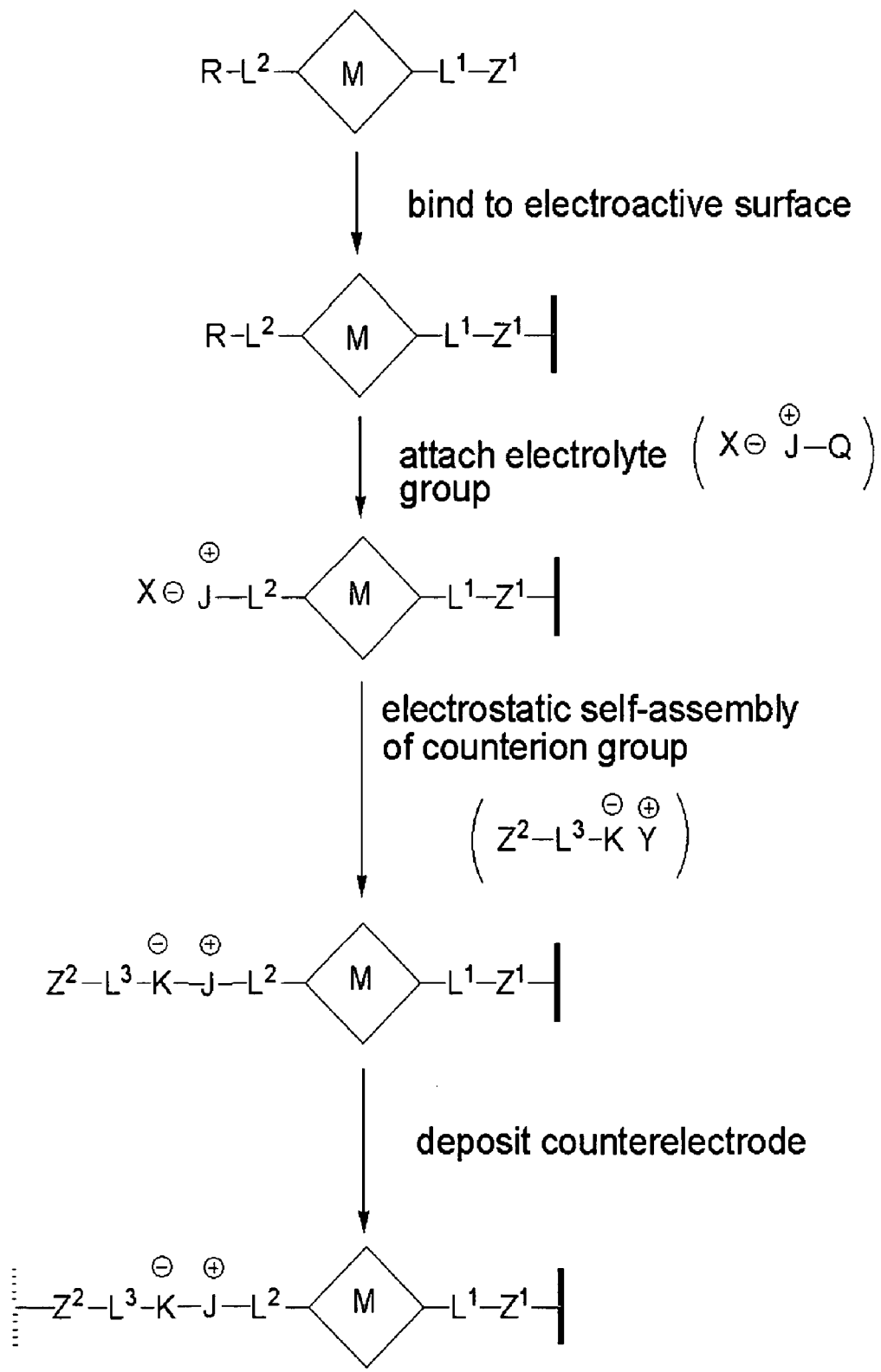
FIG. 4 shows Scheme 3 illustrating a procedure for creating a sandwich architecture of electrolyte and redox-active molecule between an electrode and a counterelectrode.

A further example of a fabrication strategy is shown in Scheme 3 (FIG. 4). In this case, the first steps are performed, for example, as the first two steps in Scheme 1 or the first three steps in Scheme 2.

This is followed by the electrostatic self-assembly of a counterion group. In this step, a reagent is added that has (a) a charged material (K) (e.g. an electrolyte) with fixed charge complementary to that of the bound electrolyte (J), a surface attachment group ($Z^2$) for binding the counterelectrode, and an optional linker ($L^3$) between the charged material K and the surface attachment group. The binding is typically electrostatic in nature although covalent bonding is not excluded from certain embodiments.

The counterelectrode is constructed by binding to the surface attachment group $Z^2$. It is understood that each surface-attachment group Z can contain a proton, protecting group, and/or a reactive group that is removed upon attachment to the surface. In this manner, a sandwich architecture is constructed in a stepwise manner, affording the charge-storage molecule and electrolyte at controlled distances between each other and between the electrode and counterelectrode. The distances are controlled by the lengths of the bonds and/or linkers ($L^1$, $L^2$, and $L^3$). Alternatively, it is feasible and sometimes attractive to simply deposit the electrolyte on top of the information storage molecule, and then to deposit the counterelectrode on the electrolyte. In this manner, only one linker ($L^1$) is created by chemical reaction in the stepwise assembly process.

It will be appreciated that these stepwise methods are illustrative. Other methods of assembling the illustrated structures (e.g. using various "preassembled" linker/reactive group structures) can also be performed using the methods described herein.

II. Reactive Groups Q and R.

A important element of the methods of this invention is the selection of of suitable attachment groups Z, Q, and R such that (1) the Q and R groups do not compete with the surface-attachment group Z during the coupling to the electrode or other underlying substrate. In addition, it is desirable that the the reaction of the Q and R groups can be accomplished efficiently under mild conditions, thereby ensuring that essentially all the information-storage molecules are derivatized without damage or displacement from the surface.

A variety of reactive functionalities can be employed in the assembly steps. Preferred functional groups are those that readily assemble at room temperature without significant byproducts. A variety of suitable reactions and groups are shown in Table 1. The types of reactive groups shown in Table 1 generally can be reacted via self-assembly procedures, where smooth reaction occurs often without added reagents.

Functional groups that also can be used, but are less preferred due to the requirement for Pd-mediated coupling reactions, include ethyne, iodo, bromo, and 4,4,5,5-tetramethyl-1,3,2-dioxaborolane. In certain embodiments, a number of considerations influence the choice of reactive groups in addition to the cleanliness and ease of reaction, including the structural rigidity of the resulting linker, the extent of electronic communication (coupling) between components afforded by the resulting linker, the resistance of the linker toward electrochemical oxidation, and the compatibility of the resulting linker toward subsequent assembly steps.

gentle conditions. Indeed, molecules with functionality as rich as that of chlorophyll b have been derivatized with these reagents (Wetherell and Hendrickson (1959) *J. Org. Chem.*, 24: 710-711; Losev and Mauzerall (1983) *Photochem. Photobiol.* 38: 355-361). It should be noted that derivatizations reagents bearing multiple charged groups can be used as well.

III. Surface Attachment Groups Linker Selection and Optimizing Memory Architecture.

A) Optimizing Linker Size.

In order to achieve fast writing and/or erasing at low voltages and a small cell size, in memory devices made using the methods of this invention, the scaling of the linkers

TABLE 1

Reactive groups and product linkages in attachment strategies.

| Reactive group R or Q | Reactive group Q or R | Other component | Product Linkage |
|---|---|---|---|
| aldehyde | acyl hydrazide | | acyl hydrazone |
| aldehyde | amine | | imine |
| aldehyde | amine | NaBH$_3$CN, Ac$_2$O | N,N-dialkylacetamide |
| salicylaldehyde | amine | | salicylaldimine |
| salicylaldehyde | acyl hydrazide | | H-bonded acyl hydrazone |
| isocyanate | amine | | urea |
| isocyanate | alcohol/phenol | | carbamate |
| isothiocyanate | amine | | thiourea |
| isothiocyanate | alcohol/phenol | | thiocarbamate |
| 2-iminothiolane | amine | | amide-alkyl-thiol |
| benzyl halide | phenol or alcohol | | ether |
| phenacyl bromide | phenol or alcohol | | phenacyl ether |
| halooacetamide | alcohol or carboxylic acid | | α-ether-acetamide or α-ester-acetamide |
| acid chloride thioester/active ester acid anhydride | amine | | amide |
| sulfonyl chloride | amine | | sulfonamide |
| boronic acid | diol | | alkyl boronate |
| acrylate | thiol | | thioether |
| aldehyde | diol | | acetal |
| epoxide | amine | | hydroxyalkylamine |
| ethyne | azide | Cu(I), Ph$_3$P | triazole |
| dipyrrin | dipyrrin | divalent metal (Zn, Mg, Pd, Cu, etc.) | bis(dipyrrinato)metal |
| phenanthroline | phenanthroline | metal (Zn, Pd, Cu, Au, etc.) | bis(phenanthrolino)metal |
| phosphonate | zirconium dichloride or zirconium hydroxide | | zirconyl phosphonate |
| acac | acac | divalent metal (Zn, Mg, Pd, Cu, etc.) | bis(acac)metal |

Figure 5:
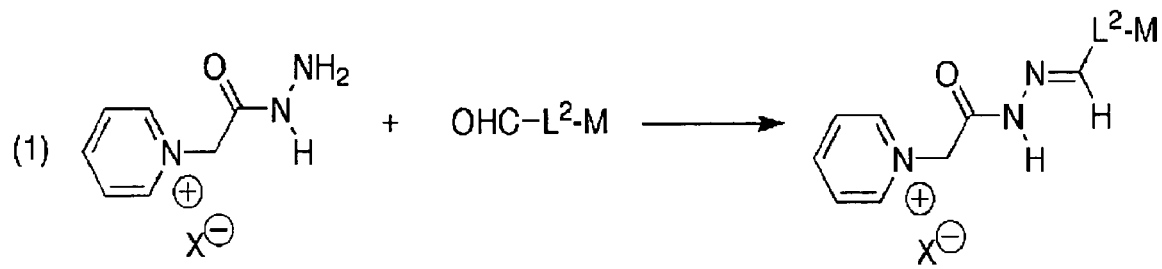
FIG. 5 shows a number of derivatization reagents for introducing a charged layer adjacent to the information storage molecules.
Figure 5:
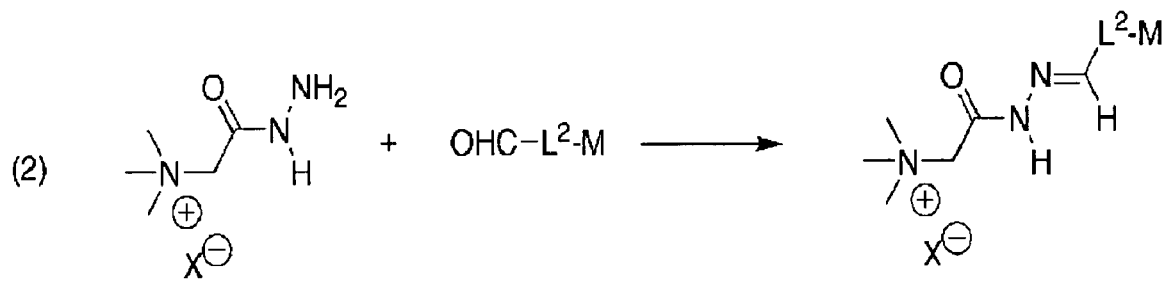
Figure 5:
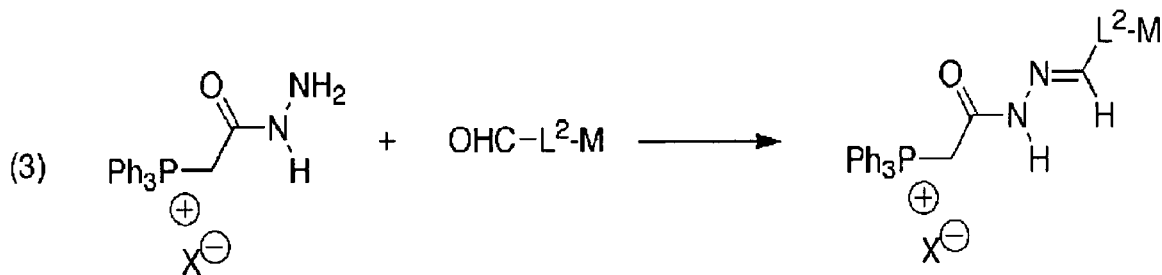
Figure 5:
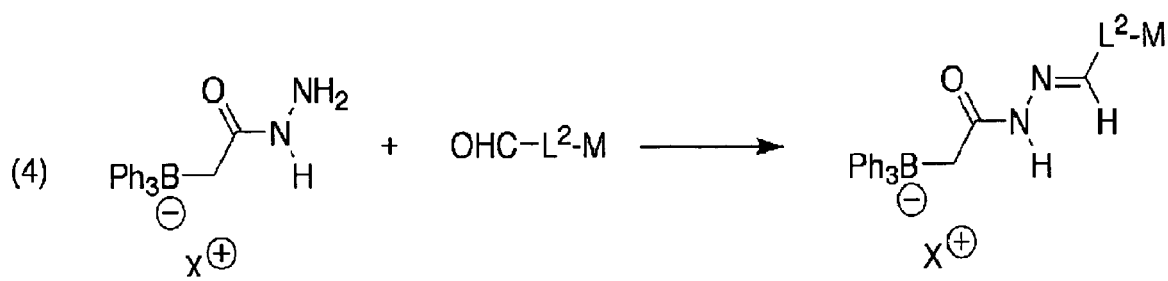

Some examples of the chemistries shown in Table 1 are displayed in FIG. 5. The examples shown in entries 1-4 all entail imine formation by reaction of an aldehyde (attached to the information-storage molecule, displayed as M) and a hydrazide (bearing the charged group). In entries 1-3, the derivatizing reagents have a fixed positive charge and mobile anion, while in entry 4 the derivatizing reagents bears a fixed negative charge and a mobile cation. The derivatizing reagents in entries 1 and 2 are the commercially available compounds Girard's Reagent P and Girard's Reagent T, respectively. These reagents have been used for decades as a means of derivatizing aldehydes under very (e.g., $L^1$ and $L^2$) is optimized. In order to maximize the charge on the molecules, the capacitance associated with $L^2$ is preferably high compared to the total capacitance of the device. This property, called the coupling ratio, allows low voltage operation because a higher capacitance will result in a larger amount of charge deposition on the information storage molecules at lower potentials. If $L^1$ is reduced, then the tunneling current increases, causing a reduction in the write and erase times which can reduce the write and erase times and thereby improving the programming and erasing efficiency. On the other hand, a reduced $L^1$ will result in a reduced coupling ratio, which in turn determines what percentage of the control gate voltage is coupled on to the molecules. The gate coupling ratio (α) can be expressed as $$\alpha = \frac{C_2}{C_1 + C_2} = \frac{1}{1 + \frac{A_1}{A_2}\frac{L_2}{L_1}}$$

where C is the capacitance, A is the area and L is the linker length. The gate coupling ratio can be increased by: (a) thinning down $L^2$, (b) using a high dielectric constant for $L^2$, (c) increasing the area of the control gate spacer, or (d) combining the above approaches.

Accordingly, with decreasing $L^1$ length, a smaller amount of control gate voltage is coupled onto the molecules since the coupling ratio has decreased. However, the effect of the decreasing coupling ratio should be balanced with the increase in writing speed that comes with $L^1$ reduction. Therefore the length of $L^1$ is typically reduced to keep the improvement in programming efficiency higher than the reduction of coupling ratio. Reducing $L^2$ will again improve the coupling ratio. If $L^2$ is reduced, however, a larger charge is now needed on the molecules to achieve a given threshold voltage shift in the channel. The amount of charge that can impact the threshold voltage is given by:

$$\Delta V_T = -\frac{Q_{molecules}}{C_2}$$

If $L^2$ is decreased then a larger charge is needed to impact the threshold voltage. This can decrease the programming and erasing efficiency because a longer time or a larger voltage is needed to charge the molecules to this level. Another disadvantage of $L^2$ reduction is the probability of charge leakage.

Keeping the foregoing issues in mind, the thicknesses of $L^1$ and $L^2$ can readily be chosen to obtain the best performance. If the thickness of $L^2$ is between 1× to 5× the thickness of $L^1$, then the device can be optimized to provide good threshold sensitivity, good coupling ratio and good writing and erasing efficiency.

Generally, the thickness of $L^3$ is chosen to be small enough (e.g., typically less than about 3-5 Å) to not cause any significant voltage drops. In certain embodiments, the electrolyte is a fairly resistive layer and by making it thinner we can reduce the voltage drop across it. In certain embodiments, the electrolyte thickness can be chosen to be in the range of about 1 nm to about 1000 nm, preferably about 10 nm to about 500 nm, more preferably about 10 nm to about 100 nm.

The counterelectrode can be deposited on top of the electrolyte. The formation of the counterelectrode can be achieved by a variety of methods including, but not limited to vapor deposition, spin coating or sol-gel techniques. The counterelectrode can also be incorporated on top of the electrolyte tether.

B) Surface Attachment Groups (Z) and Linkers (L).

The surface attachment groups (Z) are selected to react with the surface (e.g. electrode, counterelectrode, or other substrate) to which it is desired to attach the information storage molecules and dielectric.

The surface attachment group (Z) can be a protected or unprotected reactive site or group, optionally attached to or reactive with a linker. Attachment can also be accomplished without a distinct surface attachment group (i.e., direct attachment forming, e.g., Z can be a covalent bond). It is understood that attachment to the electroactive surface can be accompanied by loss of a proton, protecting group, or reactive entity on the reactive site Z. An example of the loss of a reactive entity is provided in the case of the amine derivatives. In certain embodiments, prior to binding, the amine is converted to the diazonium salt; loss of $N_2$ upon binding affords direct linkage to the carbon atom of the linker.

In certain embodiments, coupling involves a linker (L) and an attachment group (Z). Z can be a protected or unprotected reactive site or group on the linker. Such groups include, but are not limited to a carboxylic acid, an alcohol, a thiol, a selenol, a tellurol, a phosphonic acid, a phosphonothioate, an amine, a nitrile, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl, bromo, iodo, formyl, bromomethyl, chloromethyl, ethynyl, vinyl, allyl, 4-(ethynyl)biphen-4'-yl, 4-[2-(triisopropylsilyl)ethynyl]biphen-4'-yl, 3,5-diethynylphenyl, and 2-bromoethyl.

In certain preferred embodiments, the attachment group comprises an aryl or an alkyl group. Certain preferred aryl groups include a functional group such as bromo, iodo, hydroxy, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. Certain preferred alkyls include a functional group such as bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl.

In certain embodiments the attachment groups include, but are not limited to alcohols, thiols, S-acetylthiols, bromomethyls, allyls, iodoaryls, carboxaldehydes, ethynes, and the like. In certain embodiments, the attachment groups include, but are not limited to 4-(hydroxymethyl)phenyl, 4-(S-acetylthiomethyl)phenyl, 4-(Se-acetylselenomethyl)phenyl, 4-(mercaptomethyl)phenyl, 4-(hydroselenomethyl)phenyl, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-hydroxyphenyl, 4-(4,4,5,5-tetramethyl-1,3,2-dioxaborolan-2-yl)phenyl bromo, iodo, hydroxymethyl, S-acetylthiomethyl, Se-acetylselenomethyl, mercaptomethyl, hydroselenomethyl, formyl, bromomethyl, chloromethyl, ethynyl, vinyl, allyl, 4-[2-(4-(hydroxymethyl)phenyl)ethynyl]phenyl, 4-(ethynyl)biphen-4'-yl, 4-[2-(triisopropylsilyl)ethynyl]biphen-4'-yl, 3,5-diethynylphenyl, 2-bromoethyl, and the like. These attachment groups are meant to be illustrative and not limiting.

Examples of suitable linkers and attachment groups (L-Z-) include, but are not limited to 4-carboxyphenyl, carboxymethyl, 2-carboxyethyl, 3-carboxypropyl, 2-(4-carboxyphenyl)ethynyl, 4-(2-(4-carboxyphenyl)ethynyl)phenyl, 4-carboxymethylphenyl, 4-(3-carboxypropyl)phenyl, 4-(2-(4-carboxymethylphenyl)ethynyl)phenyl; (b) 4-hydroxyphenyl, hydroxymethyl, 2-hydroxyethyl, 3-hydroxypropyl, 2-(4-hydroxyphenyl)ethynyl, 4-(2-(4-hydroxyphenyl)ethynyl)phenyl, 4-hydroxymethylphenyl, 4-(2-hydroxyethyl)phenyl, 4-(3-hydroxypropyl)phenyl, 4-(2-(4-hydroxymethylphenyl)ethynyl)phenyl; (c) 4-mercaptophenyl, mercaptomethyl, 2-mercaptoethyl, 3-mercaptopropyl, 2-(4-mercaptophenyl)ethynyl, 4-(2-(4-mercaptophenyl)ethynyl)phenyl, 4-mercaptomethylphenyl, 4-(2-mercaptoethyl)phenyl, 4-(3-mercaptopropyl)phenyl, 4-(2-(4-mercaptomethylphenyl)ethynyl)phenyl; (d) 4-selenylphenyl, selenylmethyl, 2-selenylethyl, 3-selenylpropyl, 2-(4-selenylphenyl)ethynyl, 4-selenylmethylphenyl, 4-(2-selenylethyl)phenyl, 4-(3-selenylpropyl)phenyl, 4-selenylmethylphenyl, 4-(2-(4-selenylphenyl)ethynyl) phenyl; (e) 4-tellurylphenyl, tellurylmethyl, 2-tellurylethyl, 3-tellurylpropyl, 2-(4-tellurylphenyl)ethynyl, 4-(2-(4-tellurylphenyl)ethynyl)phenyl, 4-tellurylmethylphenyl, 4-(2-tellurylethyl)phenyl, 4-(3-tellurylpropyl)phenyl, 4-(2-(4-tellurylmethylphenyl)ethynyl)phenyl; (f) 4-(dihydroxyphosphoryl)phenyl, (dihydroxyphosphoryl)methyl, 2-(dihydroxyphosphoryl)ethyl, 3-(dihydroxyphosphoryl)propyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl] phenyl; (g) 4-(hydroxy(mercapto)phosphoryl)phenyl, (hydroxy(mercapto)phosphoryl)methyl, 2-(hydroxy(mercapto)phosphoryl)ethyl, 3-(hydroxy(mercapto)phosphoryl)propyl, 2-[4-(hydroxy(mercapto)phosphoryl)phenyl] ethynyl, 4-[2-[4-(hydroxy(mercapto)phosphoryl)phenyl] ethynyl]phenyl, 4-[(hydroxy(mercapto)phosphoryl) methyl]phenyl, 4-[2-(hydroxy(mercapto)phosphoryl) ethyl]phenyl, 4-[2-[4-(hydroxy(mercapto)phosphoryl) methylphenyl]ethynyl]phenyl; (h) 4-cyanophenyl, cyanomethyl, 2-cyanoethyl, 3-cyanopropyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl]phenyl; 4-cyanobiphenyl, (i)4-aminophenyl, aminomethyl, 2-aminoethyl, 3-aminopropyl, 2-(4-aminophenyl)ethynyl, 4-[2-(4-aminophenyl) ethynyl]phenyl, 4-aminobiphenyl, and the like.

Additional surface attachment groups include, but are not limited to: 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-(4,4,5,5-tetramethyl-1,3,2-dioxaborolan-2-yl)phenyl bromo, iodo, formyl, bromomethyl, chloromethyl, ethynyl, vinyl, allyl, 4-(ethynyl)biphen-4'-yl, 4-[2-(triisopropylsilyl)ethynyl]biphen-4'-yl, 3,5-diethynylphenyl, 2-bromoethyl, and the like.

In addition to the monodentate linker-surface attachment groups described above, multidentate linkers can be employed (see, e.g., Nikitin (2003) Chem. Commun., 282-283; Hu and Mattern (2000) J. Org. Chem., 65, 2277-2281; Yao and Tour (1999) Org. Chem., 64: 1968-1971; Fox et al. (1998) Langmuir, 14, 816-820; Galoppini and Guo (2001) Am. Chem. Soc., 123: 4342-4343; Deng et al. (2002) Org. Chem., 67: 5279-5283; Hecto et al. (2001) Surface Science, 494, 1-20; Whitesell and Chang (1993) Science, 261, 73-76; Galoppini et al. (2002) J. Am. Chem. Soc., 67: 7801-7811; Siiman et al. Bioconjugate Chem., 11: 549-556).

The suitability of other attachment groups can readily be evaluated. A redox-active polymer bearing the attachment group(s) of interest (directly or on a linker) is coupled to a substrate (e.g., hydrogen-passivated silicon) according to the methods described herein. The efficacy of attachment can then be evaluated electrochemically, e.g., using sinusoidal voltammetry as described above.

In addition to the monodentate linker-surface attachment groups described above, multidentate linkers can be employed (see, e.g., Nikitin (2003) Chem. Commun. 282-283; Hu and Mattern (2000) J. Org. Chem. 65: 2277-2281; Yao and Tour (1999) J. Org. Chem. 64: 1968-1971; Fox et al. (1998) Langmuir, 14: 816-820; Galoppini and Guo (2001) J. Am. Chem. Soc., 123: 4342-4343; Deng et al. (2002) J. Org. Chem. 67: 5279-5283; Hector et al. (2001) Surface Science, 494: 1-20; Whitesell and Chang (1993) Science, 261: 73-76; Galoppini et al. (2002) J. Am. Chem. Soc. 67: 7801-7811; Siiman et al. (2000) Bioconjugate Chem. 11: 549-556, and the like for various multidentate linkers).

Tripodal linkers bearing thiol, carboxylic acid, alcohol, or phosphonic acid units are particularly attractive for firmly anchoring a molecular device in an upright configuration on a planar surface. Specific examples of such linkers are built around the triphenylmethane or tetraphenylmethane unit, including, but are not limited to: 1,1,1-tris[4-(S-acetylthiomethyl)phenyl]methyl, 4-{1,1,1-tris[4-(S-acetylthiomethyl)phenyl]methyl}phenyl, 1,1,1-tris[4-(dihydroxyphosphoryl)phenyl]methyl, 4-{1,1,1-tris[4-(dihydroxyphosphoryl)phenyl]methyl}phenyl, 1,1,1-tris[4-(dihydroxyphosphorylmethyl)phenyl]methyl, 4-{1,1,1-tris[4-(dihydroxyphosphorylmethyl)phenyl]methyl}phenyl, and the like.

Certain preferred examples of linkers (L) include, but are not limited to methyl, ethyl, propyl, butyl, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, 4,4''-terphenyl, 4,4'''-quatterphenyl, and no linker (i.e., C—C single bond).

D) Charged Moieties (K).

As described above, Scheme 3 illustrated in (FIG. 4) involves the electrostatic self-assembly of a counterion group. In this step, a reagent is added that has (a) a charged material (K) (e.g. an electrolyte) with fixed charge complementary to that of the bound electrolyte (J), a surface attachment group ($Z^2$) for binding the counterelectrode, and an optional linker ($L^3$) between the charged material K and the surface attachment group. The binding is typically electrostatic in nature although covalent bonding is not excluded from certain embodiments.

Examples of K include, but are not limited to, fixed anionic groups (e.g., carboxylic acid, sulfonic acid, phosphonic acid, trialkyl boronate, triarylboronate), and fixed cationic groups (e.g., trimethylammonium, 4-(N-methylpyridyl), N-pyridyl, trialkylphosphonium, triarylphosphonium). Upon attachment of the charged layer to the SAM via the derivatization step, the counterion (cation or anion) can be exchanged via a standard ion exchange washing process. In this manner, the mobile ion can be varied as needed from small ions (e.g., $Li^+$ or $Cl^-$) to large ions (e.g., $Ph_4P^+$ or $Ph_4B^-$). Such an ion-exchange process affords considerable latitude in the nature of the groups that are attached. In certain embodiments, the counterion is selected from the halogens, alkali earth metals, $R_4N$, $PF_6$, $ClO_4$, etc. as needed, but need not be limited to such groups.

Figure 6:
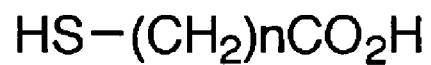
FIG. 6 shows illustrative examples of $Z^3$-$L^3$-K-$Y^+$ groups.
Figure 6:
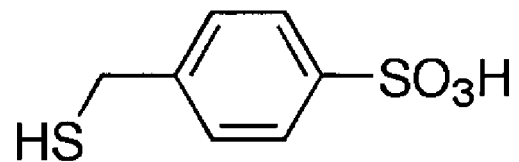
Figure 6:
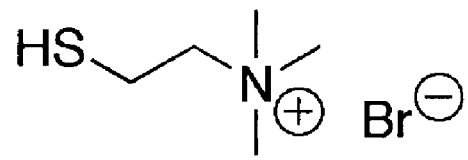
Figure 6:
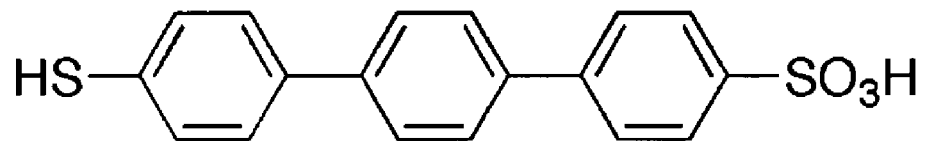
Figure 6:
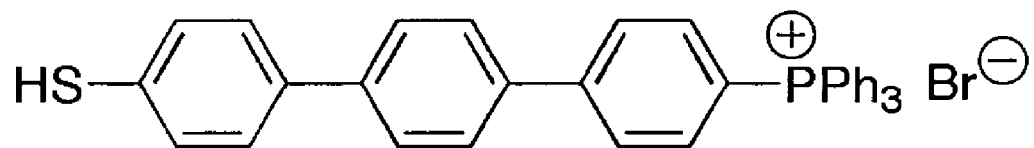

Specific examples of $Z^2$-$L^3$-$K^-Y^+$ (see FIG. 4) include, but are not limited to: 11-mercaptoundecanoic acid, 16-mercaptohexadecanoic acid, 3-mercapto-1-propanoic acid, (2-mercaptoethyl)trimethylammonium bromide, 4-(mercaptomethyl)benzenesulfonic acid. Teshe and other illustrative suitable structures are shown in FIG. 6.

IV. The Electrolyte.

A wide variety of electrolytes are suitable for practice of the methods of this invention. Suitable electrolytes include, but are not limited to solids, liquids, and gels that preferably bear fixed charge, most preferably fixed anionic groups. Electrolytes are well known to those of skill in the art and include, for instance, polymer electrolytes (e.g. solid solutions of alkali metal salts (typically lithium salts) in polymer hosts such as poly(ethylene oxide), e.g., PEOpolyethylene oxide(PEO)$_{16}$/LiClO$_4$ polymer), gel electrolytes (see, e.g., Fuller et al. (1998) *J. of Electroanal. Chem.*, 459: 29-34; Noda et al. (2000) *Electrochimica Acta*, 45: 1265-1270;. Allcock et al. (2001) *Solid State Ionics*, 143: 297-308, Chen-Yang et al. (1997) *Macromolecules*, 30: 3825-3831, etc.), Nafion™, and the like.

Examples of electrolyte units include, but are not limited to, compounds bearing fixed anionic groups (trialkyl boronate, triarylboronate), fixed cationic groups (trimethylammonium, 4-(N-methylpyridyl), 4-(N-benzylpyridyl), trialkylphosphonium, triarylphosphonium), or ionizable groups by acid dissociation (carboxylic acid, sulfonic acid, phosphonic acid, phosphoric acid) or base protonation (amine). A layer of charge also can be introduced by construction of one or more layers of zirconyl phosphonate or zirconyl phosphate units.

Upon attachment of the charged layer to the SAM via the derivatization (or deposition) step, the counterion (cation or anion) can be exchanged via a standard ion exchange washing process. In this manner, the mobile ion can be varied as needed from small ions (e.g., Li$^+$ or Cl$^-$) to large ions (e.g., Ph$_4$P$^+$ or Ph$_4$B$^-$). Such an ion-exchange process affords considerable latitude in the nature of the groups that are attached. The counterion can be selected from the halogens, alkaline earth metals, R$_4$N$^+$, PF$_6^-$, ClO$_4^-$, etc. as needed.

The electrolyte thickness it typically chosen to be in the range of about 1 nm to about 1000 nm, preferably about 5 nm to about 500 nm, more preferably about 10 nm to about 100 nm.

V. The Electrode and Counter Electrode.

In the methods of this invention, the information storage molecules are typically ultimately coupled to a surface. The surface can be an inert and/or non-conductive surface. More typically, however, the surface will be the surface of an electrode and/of a counterelectrode.

The electrode and/or counter electrodes are typically fabricated of materials capable of conducting electrons. The electrodes and/or counterelectrodes can comprise conductors, semiconductors, superconductors, and the like. In certain embodiments, the electrodes and/or counterelectrodes have a resistivity of less than about $10^{-2}$ ohm-meters, preferably less than about $10^{-3}$ ohm-meters, more preferably less than about $10^{-4}$ ohm-meters, and most preferably less than about $10^{-5}$, or $10^{-6}$ ohm-meters.

Certain preferred electrodes and/or counterelectrodes include metals and/or metal oxides (e.g., Au, Sn, Si). In certain embodiments particularly preferred electrodes comprise a material such as ruthenium, osmium, cobalt, rhodium, rubidium, lithium, sodium, potassium, vanadium, cesium, beryllium, magnesium, calcium, chromium, molybdenum, silicon, germanium, aluminum, iridium, nickel, palladium, platinum, iron, copper, titanium, tungsten, silver, gold, zinc, cadmium, indium tin oxide, carbon, a carbon nanotube, and the like.

Suitable semiconductors include, but are not limited to Si, Ge, Sn, Se, Te, B, diamond, P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi2P$_3$, (Cu, Ag)(Al, Ga, In, Tl, Fe)(S, Se, Te)$_2$, Si3N$_4$, Ge3N$_4$, Al$_2$O$_3$, (Al, Ga, In)$_2$(S, Se, Te)$_3$, Al$_2$CO, and appropriate combination of two or more such semiconductors. The semidconductors can optionally include one or more dopants (e.g. including, but not limited to a p-type dopant from Groups II, III, or IV of the periodic table; an n-type dopant from Group V of the periodic table).

In certain embodiments, the electrode and/or counterelectrode can be is functionalized to contain a chemical group that can be derivatized or crosslinked (e.g., a sulfate, a sulfhydryl, an amine, an aldehyde, a carboxylic acid, a phosphate, a phosphonate, an alkene, an alkyne, a hydroxyl group, a bromine, an iodine, a chlorine, a light-activatable group, a group activatable by an electric potential, etc.).

VI. Information Storage Molecules.

The methods of this invention can be used to synthesize a wide variety of hybrid components and/or devices (e.g. field effect transistors, sensors, memory elements, etc.). In certain embodiments, the methods are used to assemble hybrid memory devices where information is stored in a redox-active information storage molecule. Certain preferred redox-active molecules suitable for use in this invention are characterized by having a multiplicity of oxidation states. Those oxidation states are provided by one or more redox-active units. A redox-active unit refers to a molecule or to a subunit of a molecule that has one or more discrete oxidation states that can be set by application of an appropriate voltage. Thus, for example, in one embodiment, the redox-active molecule can comprise two or more (e.g. 8) different and distinguishable oxidation states. Typically, but not necessarily, such multi-state molecules will be composed of several redox-active units (e.g. porphyrins or ferrocenes). Each redox-active molecule is itself at least one redox-active unit, or comprises at least one redox-active unit, but can easily comprise two or more redox-active units.

Preferred redox-active molecules include, but are not limited to porphyrinic macrocycles. The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

Particularly preferred redox-active molecules include a porphyrin, an expanded porphyrin, a contracted porphyrin, a ferrocene, a linear porphyrin polymer, a porphyrin sandwich coordination complex, and a porphyrin array. These structures are described in detail in U.S. Pat. Nos. 6,208,553, 6,212,093, 6,272,038, 6,324,091, 6,381,169, and 6,451,942, and PCT Publication WO 01/03126, and the like.

Figure 7:
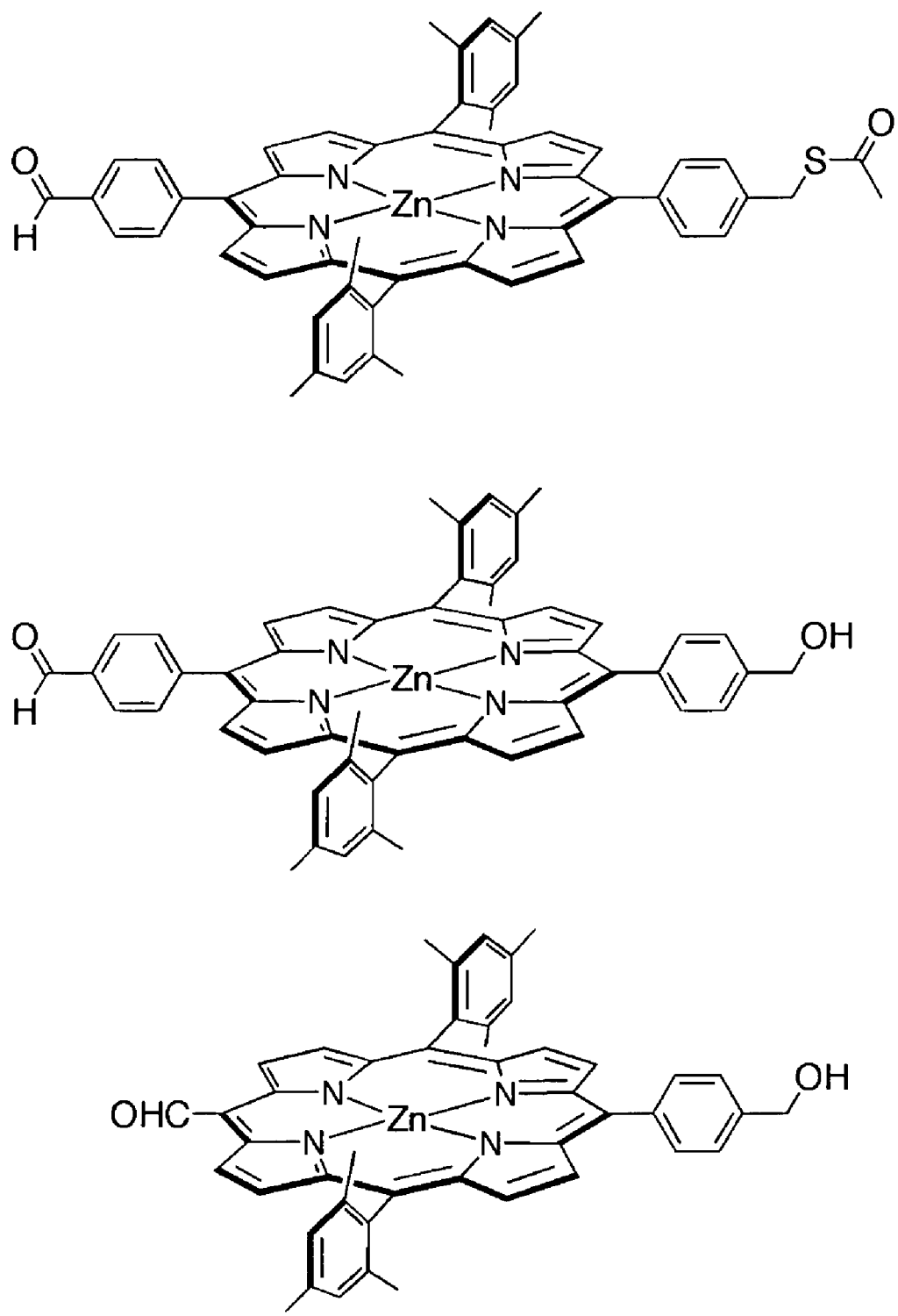
FIG. 7 illustrates a few representative information-storage molecules designed for surfaced attachment and/or for derivatization with a charged group.

An example of a suitable molecule for information storage bearing a group Z is shown in FIG. 7. The aldehyde group will not react with the S-acetylthio group nor will the aldehyde group interfere with the surface attachment chemistry.

In certain preferred embodiments, the redox-active molecule is a metallocene as shown in Formula I.

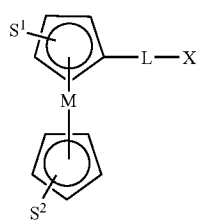

I where L is a linker, M is a metal (e.g., Fe, Ru, Os, Co, Ni, Ti, Nb, Mn, Re, V, Cr, W), $S^1$ and $S^2$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. In preferred embodiments, a substituted aryl group is attached to the porphyrin, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Particularly preferred substituents include, but are not limited to, 4-chlorophenyl, 3-acetamidophenyl, 2,4-dichloro-4-trifluoromethyl. Preferred substituents provide a redox potential range of less than about 2 volts. X is selected from the group consisting of a substrate, a reactive site that can covalently couple to a substrate (e.g. an alcohol, a thiol, etc.). It will be appreciated that in some embodiments, L-X is an alcohol or a thiol. In certain instances L-X can be replaced with another substituent (S3) like S1 or S2. In certain embodiments, L-X can be present or absent, and when present preferably is 4-hydroxyphenyl, 4-(2-(4-hydroxyphenyl)ethynyl)phenyl, 4-(hydroxymethyl)phenyl, 4-mercaptophenyl, 4-(2-(4-mercaptophenyl)ethynyl)phenyl, 4-(mercaptomethyl)phenyl, 4-hydroselenophenyl, 4-(2-(4-hydroselenophenyl)ethynyl)phenyl, 4-(hydroselenylmethyl) phenyl, 4-hydrotellurophenyl, 4-(2-(4-hydrotellurophenyl) ethynyl)phenyl, and 4-(hydrotelluromethyl)phenyl.

The oxidation state of molecules of Formula I is determined by the metal and the substituents. Thus, particular preferred embodiments are illustrated by Formulas II-VII, (listed sequentially) below:

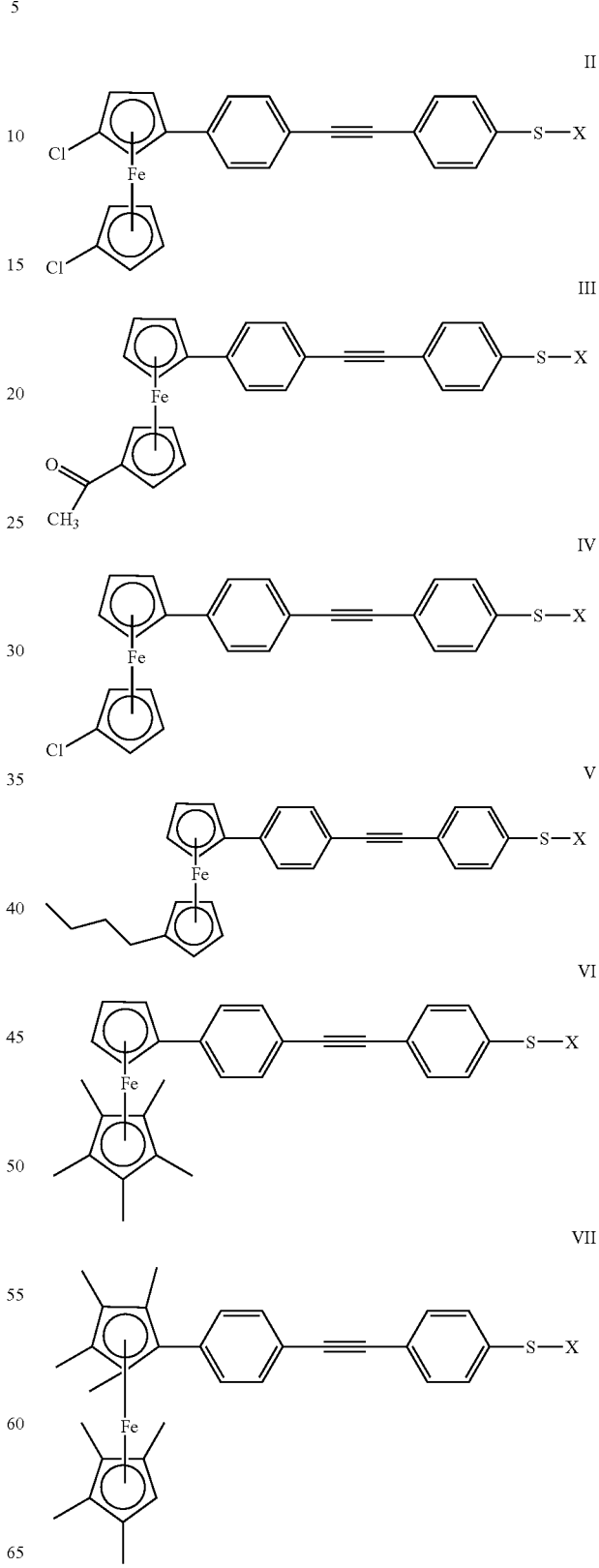

The ferrocenes listed above in Formulas II through VII provide a convenient series of one-bit molecules having different and distinguishable oxidation states. Thus the molecules of Formulas II through VII have oxidation states ($E_{1/2}$) of +0.55 V, +0.48V, +0.39 V, +0.17 V, −0.05 V, and −0.18 V, respectively, and provide a convenient series of molecules for incorporation into a storage medium of this invention. It will be appreciated that the oxidation potentials of the members of the series can be routinely altered by changing the metal (M) or the substituents.

Another preferred redox-active molecule is a porphyrin illustrated by Formula VIII.

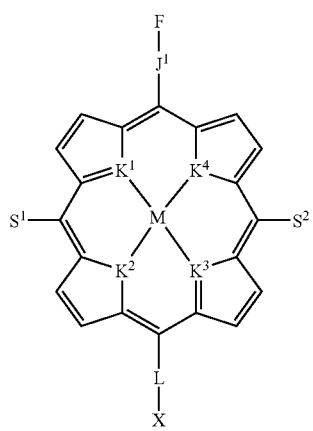

VIII where, F is a redox-active subunit (e.g., a ferrocene, a substituted ferrocene, a metalloporphyrin, or a metallochlorin, etc.), $J^1$ is a linker, M is a metal (e.g., Zn, Mg, Cd, Hg, Cu, Ag, Au, Ni, Pd, Pt, Co, Rh, Ir, Mn, B, Al, Ga, Pb, and Sn), $S^1$ and $S^2$ are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, $K_1$, $K_2$, $K_3$, and $K_4$ are independently selected from the group consisting of N, O, S, Se, Te, and CH; L is a linker; X is selected from the group consisting of a substrate, a reactive site that can covalently couple to a substrate, and a reactive site that can ionically couple to a substrate. In preferred embodiments, X or L-X is an alcohol or a thiol. In some embodiments L-X can be eliminated and replaced with a substituent independently selected from the same group as $S^1$ or $S^2$.

Control over the hole-storage and hole-hopping properties of the redox-active units of the redox-active molecules used in the memory devices of this invention allows fine control over the architecture of the memory device.

Such control is exercised through synthetic design. The hole-storage properties depend on the oxidation potential of the redox-active units or subunits that are themselves or are that are used to assemble the storage media used in the devices of this invention. The hole-storage properties and redox potential can be tuned with precision by choice of base molecule(s), associated metals and peripheral substituents (Yang et al. (1999) J. Porphyrins Phthalocyanines, 3: 117-147).

For example, in the case of porphyrins, Mg porphyrins are more easily oxidized than Zn porphyrins, and electron withdrawing or electron releasing aryl groups can modulate the oxidation properties in predictable ways. Hole-hopping occurs among isoenergetic porphyrins in a nanostructure and is mediated via the covalent linker joining the porphyrins (Seth et al. (1994) J. Am. Chem. Soc., 116: 10578-10592, Seth et al (1996) J. Am. Chem. Soc., 118: 11194-11207, Strachan et al. (1997) J. Am. Chem. Soc., 119: 11191-11201; Li et al. (1997) J. Mater. Chem., 7: 1245-1262, Strachan et al. (1998) Inorg. Chem., 37: 1191-1201, Yang et al. (1999) J. Am. Chem. Soc., 121: 4008-4018).

The design of compounds with predicted redox potentials is well known to those of ordinary skill in the art. In general, the oxidation potentials of redox-active units or subunits are well known to those of skill in the art and can be looked up (see, e.g., Handbook of Electrochemistry of the Elements). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

Various preferred redox-active molecules and the syntheses thereof include, but are not limited to those described in U.S. Pat. Nos. 6,208,553, 6,212,093, 6,272,038, 6,324,091, 6,381,169, and 6,451,942, and PCT Publication WO 01/03126, and the like.

VII. Patterning a Component/Circuit/Device.

The methods of this invention are used to fabricate a wide variety of hybrid components, circuits, or devices. Typically fabrication methods utilize typical solid state fabrication technologies coupled with the stepwise synthesis methods described herein.

The memory devices of this invention can be fabricated using standard methods well known to those of skill in the art. In certain preferred embodiments, electrode layer(s) are applied to a suitable substrate (e.g. silica, glass, plastic, ceramic, etc.) according to standard well known methods (see, e.g., Choudhury (1997) The Handbook of Microlithography, Micromachining, and Microfabrication, Soc. Photo-Optical Instru. Engineer, Bard & Faulkner (1997) Fundamentals of Microfabrication). In addition, examples of the use of micromachining techniques on silicon or borosilicate glass chips can be found in U.S. Pat. Nos. 5,194,133, 5,132,012, 4,908,112, and 4,891,120.

In one typical embodiment a metal or semiconductor layer is beam sputtered onto the substrate (e.g,. a 10 nm thick chromium adhesion layer is sputtered down followed by a 200 nm thick layer of gold). Then maskless laser ablation lithography, performed e.g., with a Nd:YAG laser, is used to create features with micron dimensions, or with an excimer laser to create features of nanometer dimensions), e.g., an array of parallel lines of conductor (e.g., gold), used as the working electrodes with dimensions ranging between a few microns to a tens of nanometers;

Once the electrode array is formed, the entire array, or portions of the array, or individual electrodes are subjected to one of more of the stepwise synthesis protocols described herein. Patterning of the molecules (e.g. information storage molecule(s), electrolyte(s), etc.) can be accomplished by any of a variety of methods. For example, the underlying surface can be masked with a resist that prevents the molecules (e.g. the linkers) from reacting with the underlying surface in areas where the information storage molecules and/or electrolyte are to be omitted. The mask can be printed in a patterned manner onto the underlying surface. Alternatively the mask can be uniformly applied to the surface and then selectively etched away. In certain embodiments, a photoactivatible resist can be applied to the surface and selectively activated (e.g. via UV light) in areas that are to be protected. Alternatively the substrate is uniformly is wetted with a photodegradable masking material and areas that are to be subjected to the stepwise synthesis methods are unmasked, e.g. using a patterned light source.

Such "photolithographic" methods are well known in the semiconductor industry (see e.g., Van Zant (2000) Microchip Fabrication: A Practical Guide to Semiconductor Processing; Nishi and Doering (2000) Handbook of Semiconductor Manufacturing Technology; Xiao (2000) Introduction to Semiconductor Manufacturing Technology; Campbell (1996) The Science and Engineering of Microelectronic Fabrication (Oxford Series in Electrical Engineering), Oxford University Press, and the like).

In other embodiments, the surface is selectively derivatized/functionalized to facilitate preferential coupling of the linkers and/or information storage molecules in particular regions.

In some embodiments, the surface attachment groups (Z) are protected/blocked with protecting groups that are activated with heat, light, electromagnetic radiation, or are chemically activated. Where heat-activated protecting groups are used, the spatial patterning of the coupling reaction can be accomplished by the use of local heating (e.g. via a laser) to determine attachment sites. Where chemically activated protecting groups are used, the activator can be pre- or post-applied to the substrate in the regions where coupling is desired. Similarly, spatial patterning can readily be accomplished using photoactivatable protecting groups and using a patterned light source (e.g. masked light source) can be used to determine the spatial distribution of coupling reactions. Photolabile protecting groups are well known to those of skill in ht eart.

Other approaches involve contact printing of the reagents, e.g. using a contact printhead shaped to selectively deposit the reagent(s) in regions that are to be coupled, use of an inkjet apparatus (see e.g. U.S. Pat. No. 6,221,653) to selectively deposit reagents in particular areas, use of dams to selectively confine reagents to particular regions, and the like.

It will be appreciated that stepwise syntheses can be applied to different regions of the electrode array to produce storage cells comprising different storage medium and/or different electrolytes. Methods of spotting different reagents on surfaces (e.g. on glass surfaces) at densities up to tens of thousands of different species/spots per cm$^2$ are known (see, e.g., U.S. Pat. No. 5,807,522).

VIII. Use of the Storage Device in Computer Systems.

Figure 11A:
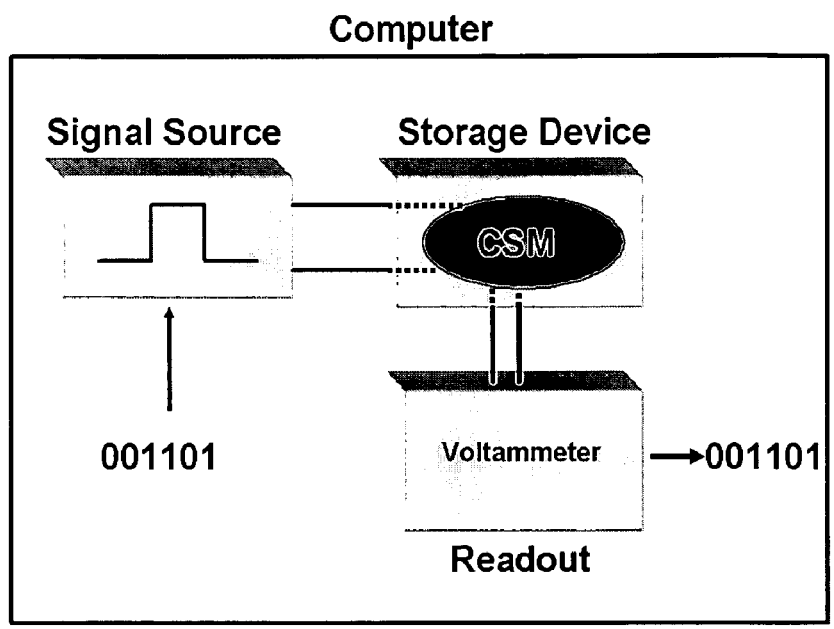
FIGS. 11A and 11B various computer architectures incorporating certain memory devices according to this invention.

The use of the storage devices fabricated according to the methods of this invention in computer systems is contemplated. One such computer system is illustrated in FIG. 11A. The computer comprises a signal source (e.g. I/O device or CPU) a storage device of this invention and appropriate circuitry (e.g. voltammetry circuitry) to read the state(s) of the storage device. In operation, voltages representing the bits to be stored are applied to the working electrodes of the storage device thereby setting the memory. When retrieval is necessary (e.g. for output, or further processing) the state(s) of the storage device is read by the I/O circuitry and the information is passed off to other elements (e.g. CPU) in the computer.

Figure 11B:
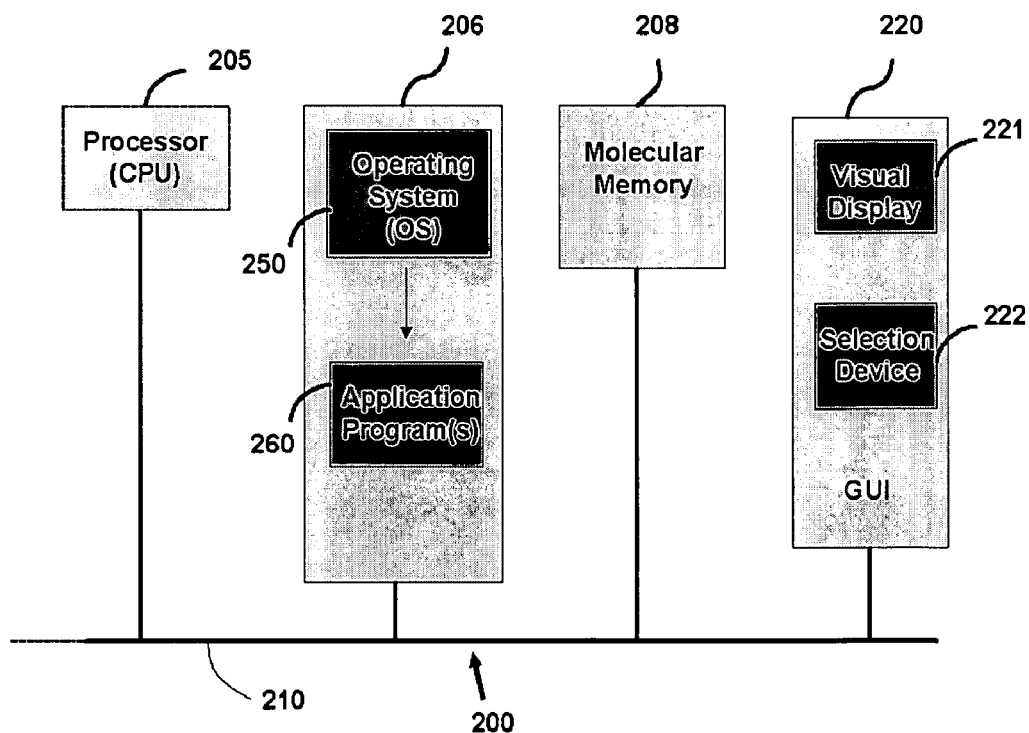

FIG. 11B illustrates the memory devices of this invention integrated into a standard computer architecture or computer system 200. The hardware of system 200 includes a processor (CPU) 205, a memory 206 (which can comprise molecular memory devices), a persistent storage 208 which does comprise molecular memory devices of this invention, and hardware for a graphical user interface (GUI) 220, coupled by a local bus or interface 210. The persistent memory 208 can include the elements shown in FIG. 11A. System 200 can further include additional hardware components (not shown).

System 200 can be, for example, a personal computer or workstation. Processor 205 can be, for example, a microprocessor, such as the 80386, 80486 or Pentium™ microprocessor, made by Intel Corp. (Santa Clara, Calif.). Memory 206 can include, for example, random-access memory (RAM), read-only memory (ROM), virtual memory, molecular memory (FIG. 11) or any other working storage medium or media accessible by processor 205. Persistent storage 208 can include a hard disk, a floppy disk, an optical or magneto-optical disk, a molecular memory or any other persistent storage medium. GUI 220 facilitates communications between a user and system 200. Its hardware includes a visual display 221 and a selector device (mouse, keyboard, etc.) 222. Through visual display 221, system 200 can deliver graphical and textual output to the user. From selector device 222, system 200 can receive inputs indicating the user's selection of particular windows, menus, and menu items. Visual display 221 can include, for example, a cathode-ray tube (CRT) or flat-panel display screen, or a head-mounted display such as a virtual reality display. Selector device 222 can be, for example, a two-dimensional pointing device such as a mouse, a trackball, a track pad, a stylus, a joystick, or the like. Alternatively or additionally, selector device 222 can include a keyboard, such as an alphanumeric keyboard with function and cursor-control keys.

The software of system 200 includes an operating system 250 and an application program 260. The software of system 200 can further include additional application programs (not shown). Operating system 150 can be, for example, the Microsoft® Windows™ 95 operating system for IBM PC and compatible computers having or emulating Intel 80386, 80486, or Pentium™ processors. Alternatively, the operating system can be specialized for operation utilizing molecular memory elements. Application program 160 is any application compatible with the operating system and system 200 architecture. Persons of skill in the art will appreciate that a wide range of hardware and software configurations can support the system and method of the present invention in various specific embodiments.

EXAMPLES

The following examples are offered to illustrate, but not to limit the claimed invention.

Example 1

Figure 8:
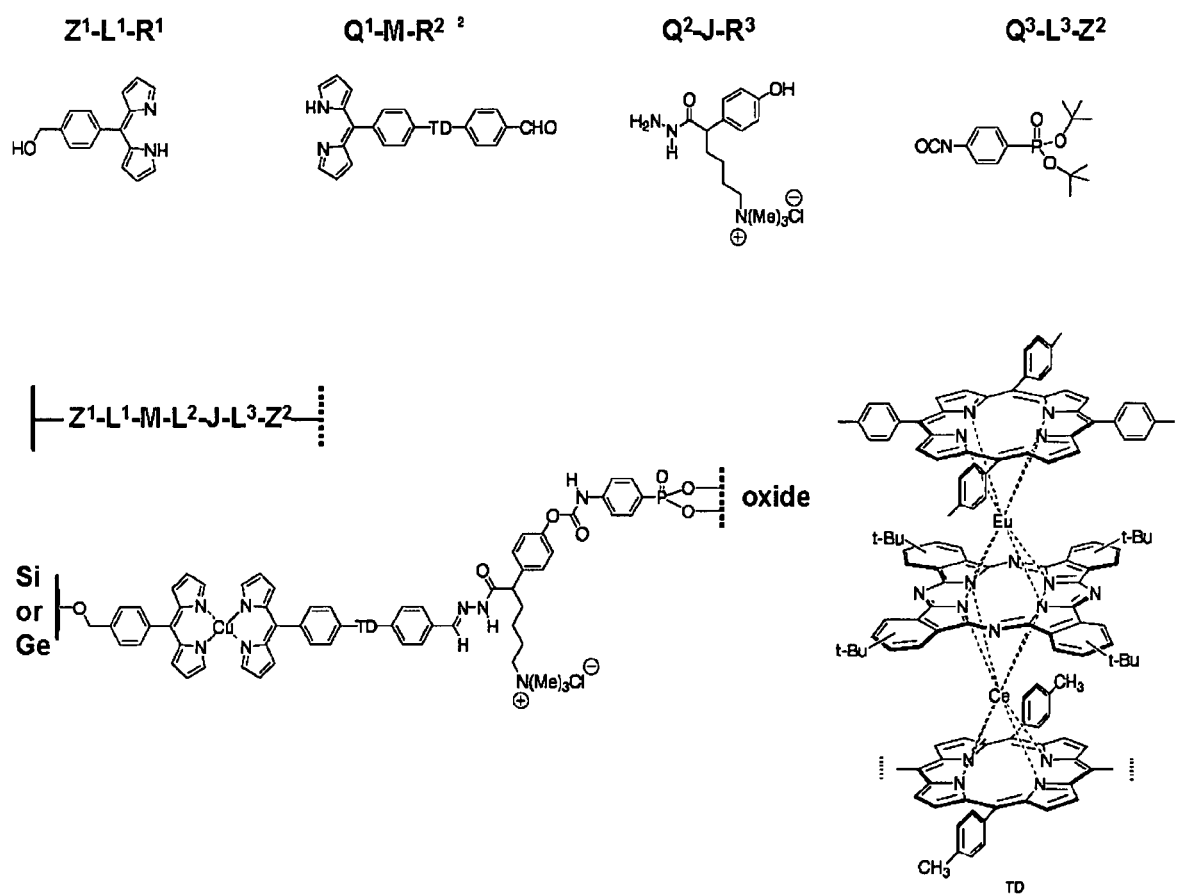
FIG. 8 illustrates Scheme 4 showing an example of the components employed in the stepwise assembly of a molecular-based information-storage device employing a heteroleptic heteronuclear triple decker sandwich coordination compound.

One first example of the stepwise fabrication strategy is shown in Scheme 4 (FIG. 8). A free base dipyrrin bearing a benzyl alcohol unit is reacted at high concentration and high temperature to give attachment to a semiconductor surface such as silicon or germanium (see, e.g., copending application U.S. Ser. No. 10/040,059, filed on Oct. 16, 2001). Copper acetate is then added, forming the copper-dipyrrin adduct. A triple decker sandwich coordination compound (see, e.g, U.S. Pat. Nos. 6,451,942, 6,212,093, and 6,272,038) bearing a free base dipyrrin is then added to give assembly of the bis(dipyrrinato)copper(II) complex. Bis(dipyrrinato) metal complexes form readily upon exposure of the free base dipyrrin to a metal acetate (see, e.g., Brückner et al. (1996) *Can. J. Chem.* 74: 2182-2193). The triple decker affords four cationic states and thus is well suited for multibit information storage. The triple decker also bears a benzaldehyde substituent, which can be derivatized in the next step. Triple-decker building blocks having this level of complexity have been prepared (see, e.g., Li et al. (2000) *J. Org. Chem.*, 65L 7379-7390; Gryko et al. (2001) *J. Mater. Chem.*, 11: 1162-1180; Gross et al. (2001) *Inorg. Chem.* 40: 4762-4774). One reagent for derivatization of the benzaldehyde is related to the Girard family of reagents, which consist of an acid hydrazide to which is attached a pyridyl unit (Girard's reagent P) or a trimethylammonium unit (Girard's reagent T). The Girard reagents have been used for decades as a means of derivatizing aldehydes under very gentle conditions. Indeed, molecules as elaborate as chlorophyll b have been derivatized with these reagents (Wetherell and Hendrickson (1959) *J. Org. Chem.*, 24: 710-711; Losev and Mauzerall (1983) *Photochem. Photobiol.*, 38: 355-361). In this case, the modified Girard's reagent bears two reactive groups (acid hydrazide, phenol) and a fixed charge. Following the formation of the hydrazone, the phenol is reacted with a phenyl isocyanate compound bearing a protected phosphonate unit. The reaction of the isocyanate and the phenol affords the diaryl carbamate. Deprotection of the phosphonate is achieved with a mild non-nucleophilic base. The counterelectrode is then deposited on the phosphonate species. A wide variety of metal oxides can be used for the counterelectrode. Following each assembly reaction, the excess incoming reactant and any reagents can be washed away.

It should be noted that reactants bearing multiple charged groups can be used for the attached electrolyte. Also, the mobile charge (chloride is shown in Scheme 4) can be exchanged to introduce the mobile counterion of choice (chosen for charge density, mobility, etc.). It is noteworthy that the triple decker is exceptionally resilient and does not undergo decomposition (or metal exchange) under the conditions required for this multistep assembly process.

Example 2

Figure 9:
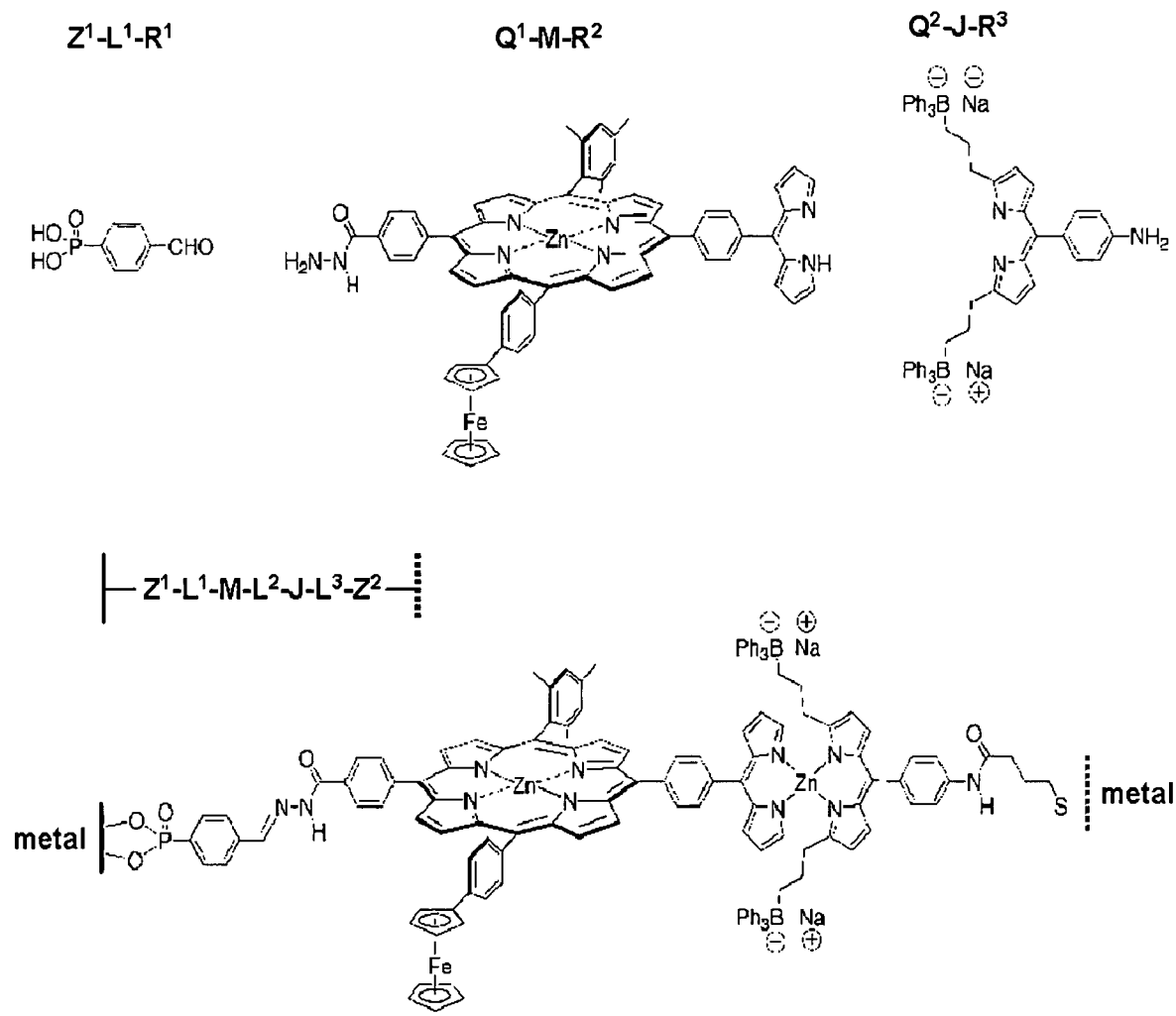
FIG. 9 illustrates Scheme 5 showing an example of the components employed in the stepwise assembly of a molecular-based information-storage device employing a ferrocene-zinc porphyrin.

A second example of the stepwise fabrication strategy is shown in Scheme 5 (FIG. 9). An oxide surface (e.g., zirconium oxide, silicon dioxide, titanium dioxide) is treated with 4-(dihydroxyphosphoryl)benzaldehyde, achieving attachment under mild conditions (Vermeulen (1997) *Prog. Inorg. Chem.*, 44: 143-166; Katz (1994) *Chem. Mater.*, 6: 2227-2232). Then a ferrocene-zinc porphyrin bearing an acid hydrazide and a free base dipyrrin is exposed to the surface, affording the corresponding hydrazone. The ferrocene-zinc porphyrin affords three cationic states and thus is well suited for multibit information storage. Ferrocene-zinc porphyrin building blocks approaching this level of complexity have been prepared (Gryko, et al. (2000) *J. Org. Chem.*, 65: 7356-7362). A metal reagent such as zinc acetate is then added, followed by a free base dipyrrin bearing two charged groups and an aniline substituent. The bis(dipyrrinato)zinc(II) species forms readily. The aniline unit is then derivatized with 2-iminothiolane (Traut's reagent), yielding the amide to which is attached a free alkylthiol. A wide variety of metals can be deposited on the thiols.

Example 3

Figure 10:
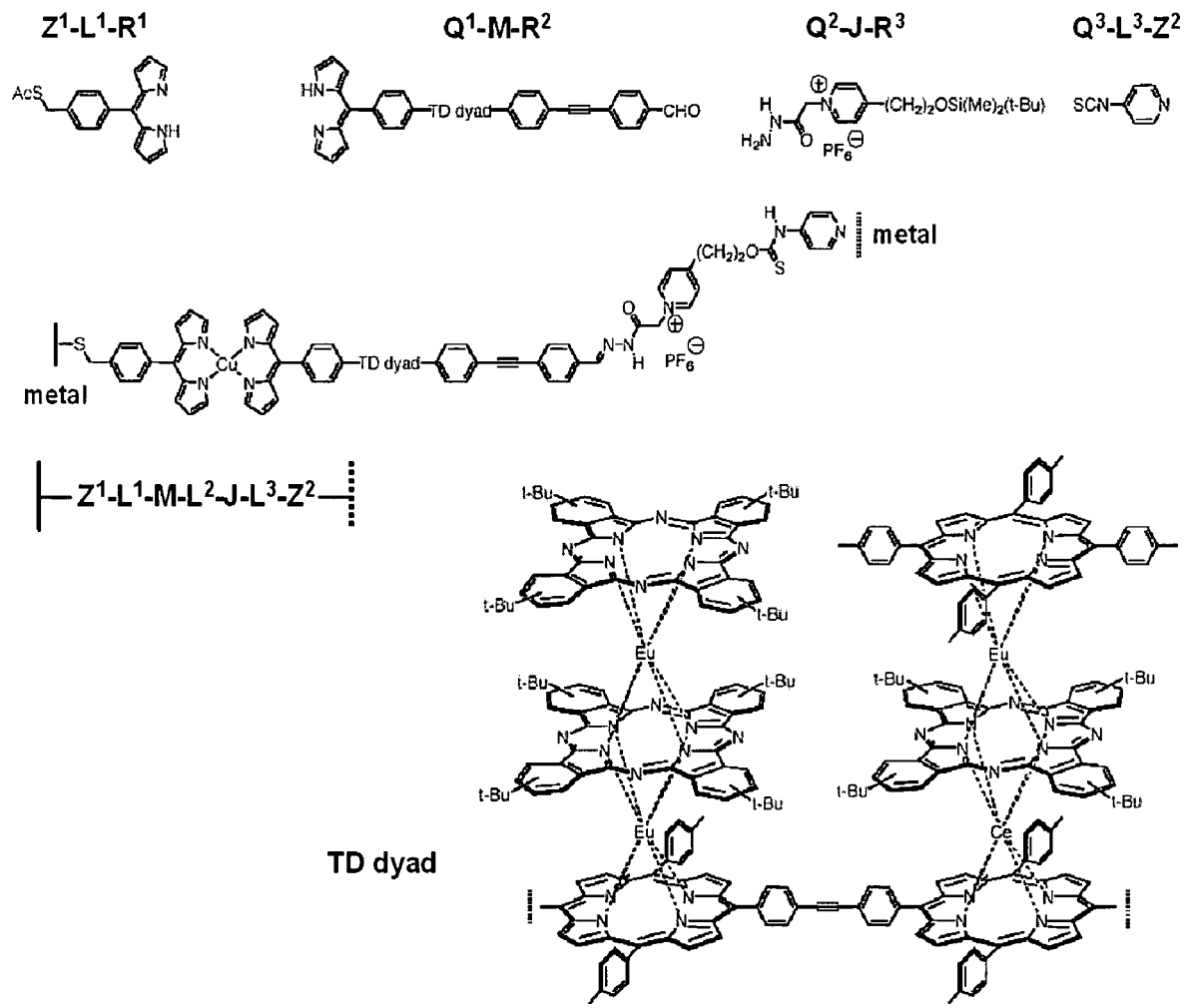
FIG. 10 illustrates Scheme 6 showing an example of the components employed in the stepwise assembly of a molecular-based information-storage device employing a dyad of a heteroleptic heteronuclear triple decker sandwich coordination compounds.

A third example of the stepwise fabrication strategy is shown in Scheme 6 (FIG. 10). A free base dipyrrin bearing an S-acetylthio group is exposed to a metal surface (e.g., Au). The S-acetyl group is removed in situ (Tour et al. (1995) *J. Am. Chem. Soc.*, 117: 9529-9534; Gryko et al. (1999) *J. Org. Chem.*, 64: 8635-8647). The surface is treated with copper acetate followed by a triple decker dyad bearing a free base dipyrrin and a formyl-substituted diphenylethyne linker. The triple decker dyad affords seven cationic states and thus is well suited for multibit information storage. Triple-decker dyads having this level of complexity have been prepared (Schweikart et al. (2002) *J. Mater. Chem.* 12: 808-828). The bis(dipyrrinato)copper(II) species forms readily. The carboxaldehyde is then derivatized with a p-(trimethylsilyloxy) substituted Girard's reagent P. The trimethylsilyl group is removed upon treatment with a fluoride reagent under mild conditions. The linker to the counterelectrode is then introduced by reaction with 4-pyridylisothiocyanate, forming the thiocarbamate. A wide variety of metals can be deposited on the pyridyl unit. Note that additional charged material can be incorporated in this assembly as needed by electrostatic binding to the Girard's P component.

These examples are intended to be illustrative. A wide variety of combinations are possible depending on the composition of the electrode and counterelectrode, the nature of the charge-storage molecule, the type of electrolyte desired (fixed cation, mobile anion; or fixed anion, mobile cation), and the composition, structure, and length of the various linkers.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of patterning an electrolyte on a surface, said method comprising:
   i) contacting said surface with a compound having the formula:

$R-L^2-M-L^1-Z^1$ wherein
   $Z^1$ is a surface attachment group;
   $L^1$ and $L^2$ are independently selected linkers or covalent bonds;
   M is an information storage molecule comprising a redox active moiety; and
   R is a protected or unprotected reactive site or group;
   whereby said contacting is under conditions that result in attachment of said redox-active moiety to said surface via said surface attachment group; and
   ii) contacting the surface-attached redox-active moiety with an electrolyte having the formula:

$J-Q$ wherein
- J is a charged moiety; and
- Q is a reactive group that is reactive with said reactive group (R) under conditions that result in the covalent attachment of said charged moiety (J) to said information storage molecule thereby patterning said electrolyte on said surface.

2. The method of claim 1, wherein said surface attachment group ($Z^1$) reacts on contact with said surface.

3. The method of claim 1, wherein said surface attachment group ($Z^1$) is photo activated.

4. The method of claim 1, wherein said surface attachment group ($Z^1$) is heat activated.

5. The method of claim 1, wherein said surface attachment group ($Z^1$) is activated by electromagnetic radiation.

6. The method of claim 1, wherein J is positively charged.

7. The method of claim 1, wherein J is negatively charged.

8. The method of claim 1, wherein said redox-active moiety (M) is selected from the group consisting of a porphyrinic macrocycle, a porphyrin, a sandwich coordination compound of porphyrinic macrocycles, and a metallocene.

9. The method of claim 1, wherein said redox-active moiety is selected from the group consisting of a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide.

10. The method of claim 1, wherein $Z^1$ is a protected or unprotected reactive site or group selected from the group consisting of a carboxylic acid, an alcohol, a thiol, a selenol, a tellurol, a phosphonic acid, a phosphonothioate, an amine, and a nitrile.

11. The method of claim 1, wherein $-L^1-Z^1$ is selected from the group consisting of
- 4-carboxyphenyl, 2-(4-carboxyphenyl)ethynyl, 4-(2-(4-carboxyphenyl)ethynyl)phenyl,
- 4-carboxymethylphenyl, 4-(3-carboxypropyl)phenyl, 4-(2-(4-carboxymethylphenyl)ethynyl) phenyl,
- 4-hydroxyphenyl, 2-(4-hydroxyphenyl)ethynyl, 4-(2-(4-hydroxyphenyl)ethynyl)phenyl,
- 4-hydroxymethylphenyl, 4-(2-hydroxyethyl)phenyl, 4-(3-hydroxypropyl)phenyl,
- 4-(2-(4-hydroxymethylphenyl)ethynyl)phenyl, 4-mercaptophenyl,
- 2-(4-mercaptophenyl)ethynyl, 4-(2-(4-mercaptophenyl)ethynyl)phenyl,
- 4-mercaptomethylphenyl, 4-(2-mercaptoethyl)phenyl, 4-(3-mercaptopropyl)phenyl,
- 4-(2-(4-mercaptomethylphenyl)ethynyl)phenyl, 4-selenylphenyl,
- 2-(4-selenylphenyl)ethynyl, 4-selenylmethylphenyl, 4-(2-selenylethyl)phenyl,
- 4-(3-selenylpropyl)phenyl, 4-selenylmethylphenyl, 4-(2-(4-selenylphenyl)ethynyl)phenyl,
- 4-tellurylphenyl, 2-(4-tellurylphenyl)ethynyl, 4-(2-(4-tellurylphenyl)ethynyl)phenyl,
- 4-tellurylmethylphenyl, 4-(2-tellurylethyl)phenyl, 4-(3-tellurylpropyl)phenyl,
- 4-(2-(4-tellurylmethylphenyl)ethynyl)phenyl, 4-(dihydroxyphosphoryl)phenyl,
- 2-[4-(dihydroxyphosphoryl)phenyl]ethynyl,
- 4-[2-[4-(dihydroxyphosphoryl)phenyl]ethynyl]phenyl,
- 4-[(dihydroxyphosphoryl)methyl]phenyl, 4-[2-(dihydroxyphosphoryl)ethyl]phenyl,
- 4-[2-[4-(dihydroxyphosphoryl)methylphenyl]ethynyl]phenyl,
- 4-(hydroxy(mercapto)phosphoryl)phenyl,
- 2-[4-(hydroxy(mercapto)phosphoryl)phenyl]ethynyl,
- 4-[2-[4-(hydroxy(mercapto)phosphoryl)phenyl]ethynyl]phenyl,
- 4-[(hydroxy(mercapto)phosphoryl)methyl]phenyl,
- 4-[2-(hydroxy(mercapto)phosphoryl)ethyl]phenyl,
- 4-[2-[4-(hydroxy(mercapto)phosphoryl)methylphenyl]ethynyl]phenyl, 4-cyanophenyl,
- 2-(4-cyanophenyl)ethynyl, 4-[2-(4-cyanophenyl)ethynyl]phenyl, 4-(cyanomethyl)phenyl,
- 4-(2-cyanoethyl)phenyl, 4-[2-[4-(cyanomethyl)phenyl]ethynyl]phenyl; 4-cyanobiphenyl,
- 4-aminophenyl, 2-(4-aminophenyl)ethynyl, 4-[2-(4-aminophenyl)ethynyl]phenyl,
- 4-aminobiphenyl, 1,1,1-tris[4-(S-acetylthiomethyl)phenyl]methyl,
- 4-{1,1,1-tris[4-(S-acetylthiomethyl)phenyl]methyl}phenyl,
- 1,1,1-tris[4-(dihydroxyphosphoryl)phenyl]methyl,
- 4-{1,1,1-tris[4-(dihydroxyphosphoryl)phenyl]methyl}phenyl,
- 1,1,1-tris[4-(dihydroxyphosphorylmethyl)phenyl]methyl, and
- 4-{1,1,1-tris[4-(dihydroxyphosphorylmethyl)phenyl]methyl}phenyl.

12. The method of claim 1, wherein $L^1$ and $L^2$ are independently selected from the group consisting of a covalent bond, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, and 4,4''-terphenyl.

13. The method of claim 1, wherein said electrolyte bearing a reactive site (Q) is selected from the group consisting of an acyl hydrazide, an amine, a dipyrrin, acac, a phenol, an alcohol, a diol, a thiol, an azide, a phenanthroline, alkyl, halide, aldehyde, a zirconium dichloride, and a zirconium hydroxide.

14. The method of claim 1, wherein R is selected from the group consisting of a carboxaldehyde, a ketone, an o-hydroxycarboxaldehyde, a dipyrrin, an amine, and acac.

15. The method of claim 1, wherein R is a carboxaldehyde or ketone and Q is an acylhydrazide.

16. The method of claim 1, wherein R is a carboxaldehyde or ketone and Q is an amine.

17. The method of claim 1, wherein R is an o-hydroxycarboxaldehyde and Q is an amine.

18. The method of claim 1, wherein R is an o-hydroxycarboxaldehyde and Q is an acyl hydrazide.

19. The method of claim 1, wherein R is a dipyrrin and Q is a dipyrrin.

20. The method of claim 1, wherein R is acac and Q is acac.

21. The method of claim 1, further comprising contacting said charged moiety with a reagent having formula $$Z^2-L^3-K\ Y$$

wherein
- K comprises a group having a charge complementary to the charge of J;
- $L^3$ is a covalent bond or a linker;
- $Z^2$ is a surface attachment group; and
- Y is a counterion;

whereby K electrostatically associates with J thereby providing a counterion group associated with said information storage molecule where said counterion group comprises said surface attachment group $Z^2$.

22. The method of claim 21, further comprising constructing a counter-electrode by binding an electrode to said surface attachment group $Z^2$.

23. The method of claim 22, wherein said electrode comprises a conductive material.

24. The method of claim 22, wherein said electrode comprises a semiconductive material.

25. The method of claim 21, wherein $Z^2$ is a protected or unprotected reactive site or group selected from the group consisting of a carboxylic acid, an alcohol, a thiol, a selenol, a tellurol, a phosphonic acid, a phosphonothioate, an amine, and a nitrile.

26. The method of claim 21, wherein -$L^3$-$Z^2$ is selected from the group consisting of:
  4-carboxyphenyl, 2-(4-carboxyphenyl)ethynyl, 4-(2-(4-carboxyphenyl)ethynyl)phenyl,
  4-carboxymethylphenyl, 4-(3-carboxypropyl)phenyl, 4-(2-(4-carboxymethylphenyl)ethynyl) phenyl,
  4-hydroxyphenyl, 2-(4-hydroxyphenyl)ethynyl, 4-(2-(4-hydroxyphenyl)ethynyl)phenyl,
  4-hydroxymethylphenyl, 4-(2-hydroxyethyl)phenyl, 4-(3-hydroxypropyl)phenyl,
  4-(2-(4-hydroxymethylphenyl)ethynyl)phenyl, 4-mercaptophenyl,
  2-(4-mercaptophenyl)ethynyl, 4-(2-(4-mercaptophenyl)ethynyl)phenyl,
  4-mercaptomethylphenyl, 4-(2-mercaptoethyl)phenyl, 4-(3-mercaptopropyl)phenyl,
  4-(2-(4-mercaptomethylphenyl)ethynyl)phenyl, 4-selenylphenyl,
  2-(4-selenylphenyl)ethynyl, 4-selenylmethylphenyl, 4-(2-selenylethyl)phenyl,
  4-(3-selenylpropyl)phenyl, 4-selenylmethylphenyl, 4-(2-(4-selenylphenyl)ethynyl)phenyl,
  4-tellurylphenyl, 2-(4-tellurylphenyl)ethynyl, 4-(2-(4-tellurylphenyl)ethynyl)phenyl,
  4-tellurylmethylphenyl, 4-(2-tellurylethyl)phenyl, 4-(3-tellurylpropyl)phenyl,
  4-(2-(4-tellurylmethylphenyl)ethynyl)phenyl, 4-(dihydroxyphosphoryl)phenyl,
  2-[4-(dihydroxyphosphoryl)phenyl]ethynyl,
  4-[2-[4-(dihydroxyphosphoryl)phenyl]ethynyl]phenyl,
  4-[(dihydroxyphosphoryl)methyl]phenyl, 4-[2-(dihydroxyphosphoryl)ethyl]phenyl,
  4-[2-[4-(dihydroxyphosphoryl)methylphenyl]ethynyl] phenyl,
  4-(hydroxy(mercapto)phosphoryl)phenyl,
  2-[4-(hydroxy(mercapto)phosphoryl)phenyl]ethynyl,
  4-[2-[4-(hydroxy(mercapto)phosphoryl)phenyl]ethynyl] phenyl,
  4-[(hydroxy(mercapto)phosphoryl)methyl]phenyl,
  4-[2-(hydroxy(mercapto)phosphoryl)ethyl]phenyl,
  4-[2-[4-(hydroxy(mercapto)phosphoryl)methylphenyl] ethynyl]phenyl, 4-cyanophenyl,
  2-(4-cyanophenyl)ethynyl, 4-[2-(4-cyanophenyl)ethynyl] phenyl, 4-(cyanomethyl)phenyl,
  4-(2-cyanoethyl)phenyl, 4-[2-[4-(cyanomethyl)phenyl] ethynyl]phenyl; 4-cyanobiphenyl,
  4-aminophenyl, 2-(4-aminophenyl)ethynyl, 4-[2-(4-aminophenyl)ethynyl]phenyl,
  4-aminobiphenyl, 1,1,1-tris[4-(S-acetylthiomethyl)phenyl]methyl,
  4-{1,1,1-tris[4-(S-acetylthiomethyl)phenyl] methyl}phenyl,
  1,1,1-tris[4-(dihydroxyphosphoryl)phenyl]methyl,
  4-{1,1,1-tris[4-(dihydroxyphosphoryl)phenyl] methyl}phenyl,
  1,1,1-tris[4-(dihydroxyphosphorylmethyl)phenyl]methyl, and
  4-{1,1,1-tris[4-(dihydroxyphosphorylmethyl)phenyl] methyl}phenyl.

27. The method of claim 21, wherein $L^3$ is selected from the group consisting of a covalent bond, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, and 4,4"-terphenyl.

28. The method of claim 21, wherein the counterion (K) is selected from the group consisting of a halogen, an alkali earth metal, $PF_6$, and $ClO_4$.

29. The method of claim 21, wherein $Z^2$-$L^3$-K-$Y^+$ is selected from the group consisting of 11-mercaptoundecanoic acid, 16-mercaptohexadecanoic acid, 3-mercapto-1-propanoic acid, (2-mercaptoethyl)trimethylammonium bromide, and 4-(mercaptomethyl)benzenesulfonic acid.

30. The method of claim 21, wherein said counterion is altered by an ion-exchange process.

* * * * *